US011803261B2

(12) United States Patent
Kim

(10) Patent No.: US 11,803,261 B2
(45) Date of Patent: Oct. 31, 2023

(54) DISPLAY DEVICE

(71) Applicant: Samsung Display Co., Ltd., Yongin-Si (KR)

(72) Inventor: Byoungyong Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 139 days.

(21) Appl. No.: 16/906,754

(22) Filed: Jun. 19, 2020

(65) Prior Publication Data

US 2020/0401247 A1    Dec. 24, 2020

(30) Foreign Application Priority Data

Jun. 20, 2019   (KR) .......................... 10-2019-0073723

(51) Int. Cl.
*G06F 3/041* (2006.01)
*H10K 59/40* (2023.01)

(52) U.S. Cl.
CPC ............. *G06F 3/041* (2013.01); *H10K 59/40* (2023.02)

(58) Field of Classification Search
CPC ...... G06F 3/041; G06F 3/0446; G06F 3/0412; G06F 3/04164; H01L 27/323; H01L 27/3227; H01L 27/3288; H01L 27/3276; H01L 51/52; H10K 59/40; H10K 59/179; H10K 59/60; H10K 50/80; H10K 59/131
See application file for complete search history.

(56) References Cited

U.S. PATENT DOCUMENTS

| | | | |
|---|---|---|---|
| 2007/0132907 A1* | 6/2007 | Kim | G02F 1/133308 349/58 |
| 2010/0244005 A1* | 9/2010 | Gyoda | H01L 51/5246 156/182 |
| 2014/0062912 A1* | 3/2014 | Lien | G06F 3/041 345/173 |
| 2014/0204043 A1* | 7/2014 | Lin | G06F 3/04164 345/173 |
| 2014/0339574 A1* | 11/2014 | Kang | H01L 27/1218 257/88 |
| 2016/0117041 A1* | 4/2016 | Lee | G06F 3/0416 345/82 |

(Continued)

FOREIGN PATENT DOCUMENTS

JP       2014-002540       1/2014
KR    10-2018-0131010    12/2018

*Primary Examiner* — Temesghen Ghebretinsae
*Assistant Examiner* — Sosina Abebe
(74) *Attorney, Agent, or Firm* — CANTOR COLBURN LLP

(57) ABSTRACT

A display device includes a display panel, a sensing structure, a sensing signal transfer film, and a side surface connection electrode structure. The display panel includes a first surface on which an image is displayed, a second surface facing the first surface, and first and second side surfaces connecting the first surface to the second surface. The sensing structure includes a sensing electrode disposed on the first surface of the display panel. The sensing signal transfer film is disposed on the second surface of the display panel. The side surface connection electrode structure is disposed at parts of an upper surface and a side surface of the sensing structure and parts of the first side surface and the second surface of the display panel and electrically connects the sensing electrode and the sensing signal transfer film.

20 Claims, 13 Drawing Sheets

(56) References Cited

U.S. PATENT DOCUMENTS

| | | | | |
|---|---|---|---|---|
| 2016/0174332 A1* | 6/2016 | Shin | ................ | H05B 33/14 |
| | | | | 313/504 |
| 2016/0291382 A1* | 10/2016 | Chai | ................ | G06F 3/041 |
| 2016/0363803 A1* | 12/2016 | Kim | ................ | G02F 1/133308 |
| 2017/0131811 A1* | 5/2017 | Watanabe | ............ | G06F 1/1643 |
| 2018/0011235 A1* | 1/2018 | Bae | ................ | G02B 6/005 |
| 2018/0052365 A1* | 2/2018 | Bae | ................ | G02F 1/1362 |
| 2018/0069053 A1* | 3/2018 | Bok | ................ | G06F 3/0412 |
| 2018/0122875 A1* | 5/2018 | Bang | ................ | H01L 27/3248 |
| 2019/0019855 A1* | 1/2019 | Park | ................ | H05K 1/117 |
| 2019/0022985 A1 | 1/2019 | Labrot | | |
| 2019/0025620 A1* | 1/2019 | Tuan | ................ | G02F 1/1335 |
| 2019/0025881 A1 | 1/2019 | Franklin et al. | | |
| 2019/0361281 A1* | 11/2019 | Lu | ................ | H10K 59/40 |
| 2020/0020720 A1* | 1/2020 | Kim | ................ | G06F 18/10 |
| 2021/0043694 A1* | 2/2021 | Wei | ................ | H05K 1/189 |
| 2021/0223915 A1* | 7/2021 | Wang | ................ | G06F 3/0443 |

\* cited by examiner

DISPLAY DEVICE

This application claims priority to Korean Patent Application No. 10-2019-0073723 filed on Jun. 20, 2019, and all the benefits accruing therefrom under 35 U.S.C. § 119, the content of which in its entirety is herein incorporated by reference.

BACKGROUND

1. Field

Embodiments relate generally to a display device. More particularly, embodiments of the invention relate to a display device including a sensing structure.

2. Description of the Related Art

A flat panel display device has been replacing a cathode ray tube display device due to advantageous features such as a light weight and a slim structure. Representative examples of the flat panel display device include a liquid crystal display device and an organic light emitting display device.

The display device generally includes a display panel including an upper substrate, a lower substrate, a display structure disposed between the upper substrate and the lower substrate, and a sensing structure disposed on the display panel and including a sensing electrode. The display panel displays an image through the display structure, and the sensing structure senses a part of a user's body, an object, or the like that is positioned in front of the display device through the sensing electrode. In other words, the display device receives, from an external device, an image signal provided to the display panel and a sensing signal provided to the sensing structure. In order to receive the image and the sensing signals, signal transfer films for transferring the image and sensing signals are attached to a part of the display device, and thus the image and sensing signals generated from the external device are provided to the display device through the signal transfer films.

SUMMARY

Some embodiments provide a display device including a sensing structure.

An embodiment of a display device includes a display panel, a sensing structure, a sensing signal transfer film, and a side surface connection electrode structure. The display panel has a first surface on which an image is displayed, a second surface facing the first surface, and first and second side surfaces connecting the first surface to the second surface. The sensing structure includes a sensing electrode disposed on the first surface of the display panel. The sensing signal transfer film is disposed on the second surface of the display panel. The side surface connection electrode structure is disposed at parts of an upper surface and a side surface of the sensing structure and a part of the first side surface and a part of the second surface of the display panel and electrically connects the sensing electrode and the sensing signal transfer film.

In an embodiment, the side surface connection electrode structure may include a straight portion, a first extension portion, and a second extension portion. The straight portion may be disposed at the first side surface of the display panel and the side surface of the sensing structure. The first extension portion may be disposed on the part of the upper surface of the sensing structure, and may extend from a first end portion of the straight portion in a plane direction of the upper surface. The second extension portion may be disposed between the part of the second surface of the display panel and the sensing signal transfer film, and may extend from a second end portion of the straight portion in a plane direction of the second surface.

In an embodiment, the first extension portion may contact the sensing structure, and the second extension portion may contact the sensing signal transfer film.

In an embodiment, the display device may further include a protective layer partially covering the side surface connection electrode structure on the first side surface of the display panel, and the protective layer may expose at least a part of each of the first and second extension portions.

In an embodiment, the display device may further include a driving circuit board partially overlapping the sensing signal transfer film on the second surface of the display panel and electrically connected to the sensing signal transfer film at an overlapping portion.

In an embodiment, the driving circuit board may include a driving controller which generates sensing signals provided to the sensing electrode and a plurality of signals provided to the display panel to display the image.

In an embodiment, the display device may further include a side electrode disposed at the second side surface adjacent to the first side surface of the display panel.

In an embodiment, the display device may further include a driving film disposed on the second side surface and the second surface of the display panel, and the driving film may include a first end portion electrically connected to the side electrode on the second side surface and a second end portion electrically connected to the driving circuit board on the second surface.

In an embodiment, the display panel may further include a lower substrate including a display area and a peripheral area surrounding the display area, a display structure disposed in the display area on the lower substrate, and an upper substrate disposed on the display structure and facing the lower substrate.

In an embodiment, the lower substrate and the upper substrate may have a same size and overlap each other.

In an embodiment, the display panel may further include a sealing member disposed in the peripheral area between the upper substrate and the lower substrate.

In an embodiment, the display device may further include a pad electrode contacting the side electrode, disposed between the sealing member and the lower substrate, extending from the peripheral area to the display area, and electrically connected to the display structure.

An embodiment of a display device includes a display panel, a sensing structure, a sensing signal transfer film, and a side surface connection electrode structure. The display panel includes a first surface on which an image is displayed, a second surface facing the first surface, and first and second side surfaces connecting the first surface to the second surface. The sensing structure includes a sensing electrode disposed on the first surface of the display panel. The sensing signal transfer film is disposed on the first side surface and the second surface of the display panel. The side surface connection electrode structure is disposed at parts of an upper surface and a side surface of the sensing structure and the first side surface of the display panel and electrically connects the sensing electrode and the sensing signal transfer film.

In an embodiment, the side surface connection electrode structure may include a straight portion disposed at the first side surface of the display panel and a side surface of the sensing structure and a first extension portion disposed on a part of the upper surface of the sensing structure and extending in a plane direction of the upper surface.

In an embodiment, the first extension portion may contact the sensing structure and the straight portion may contact the sensing signal transfer film.

In an embodiment, the display device may further include a driving circuit board partially overlapping the sensing signal transfer film on the second surface of the display panel and electrically connected to the sensing signal transfer film at the overlapping portion, a side electrode disposed at the second side surface adjacent to the first side surface of the display panel, and a driving film disposed on the second side surface and the second surface of the display panel. The driving film may include a first end portion electrically connected to the side electrode at the second side surface and a second end portion electrically connected to the driving circuit board at the second surface.

In an embodiment, a side surface of the sensing structure may include a first inclined plane at a portion in which the side surface connection electrode structure contacts the side surface of the sensing structure, and the side surface connection electrode structure may further include a first inclined portion disposed on the first inclined plane. The first inclined portion may be disposed between the straight portion and the first extension portion.

In an embodiment, the display panel may include a second inclined plane at a portion facing the first inclined plane of the sensing structure, and the side surface connection electrode structure may further include a second extension portion disposed between a part of the second surface of the display panel and the sensing signal transfer film and a second inclined portion disposed on the second inclined plane of the display panel, in which the second incline portion is disposed between the straight portion and the second extension portion.

In an embodiment, the first extension portion may contact the sensing structure, and the second extension portion may contact the sensing signal transfer film.

In an embodiment, the display panel may further include a lower substrate including a display area and a peripheral area surrounding the display area, a display structure disposed in the display area on the lower substrate, and an upper substrate disposed on the display structure and opposite to the lower substrate. The lower substrate and the upper substrate may have a same size and overlap each other.

The display device in embodiments of the invention may include a side electrode and a side surface connection electrode structure. When the driving film is connected to the side electrode at the second side surface of the display panel, a bending radius of the driving film may be relatively reduced. In addition, when the sensing signal transfer film is connected to the side surface connection electrode structure at the second surface of the display panel, the sensing signal transfer film may not be bent. Accordingly, the display device may function as a display device having a relatively reduced dead space.

BRIEF DESCRIPTION OF THE DRAWINGS

Embodiments may be understood in more detail from the following description taken in conjunction with the accompanying drawings, in which.

DETAILED DESCRIPTION

Figure 1:
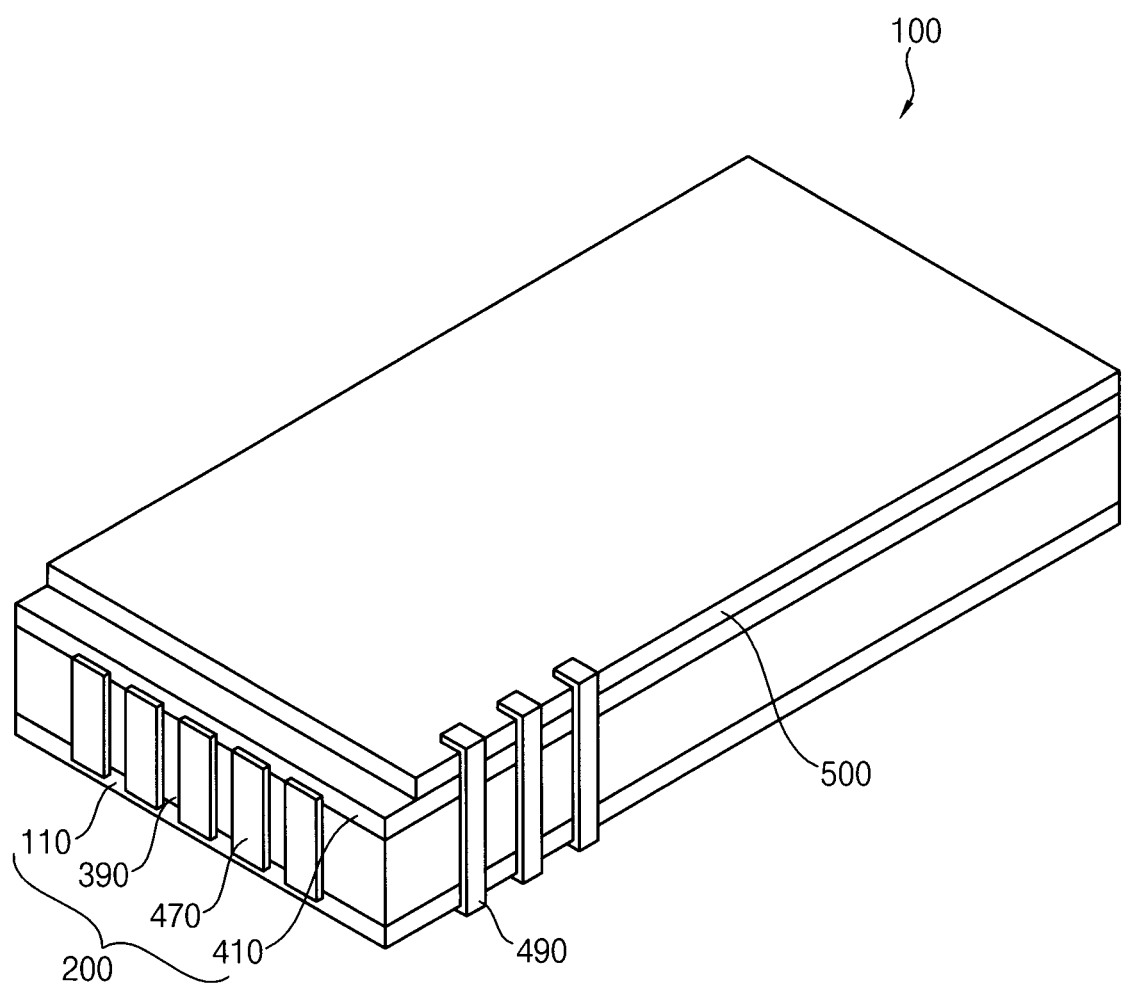
FIGS. 1 and 2 are perspective views illustrating an embodiment of a display device according to the invention.
Figure 1:
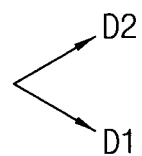

Hereinafter, embodiments of display devices according to the invention will be described in detail with reference to the accompanying drawings. In the accompanying drawings, same or similar reference numerals refer to the same or similar elements.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 2:
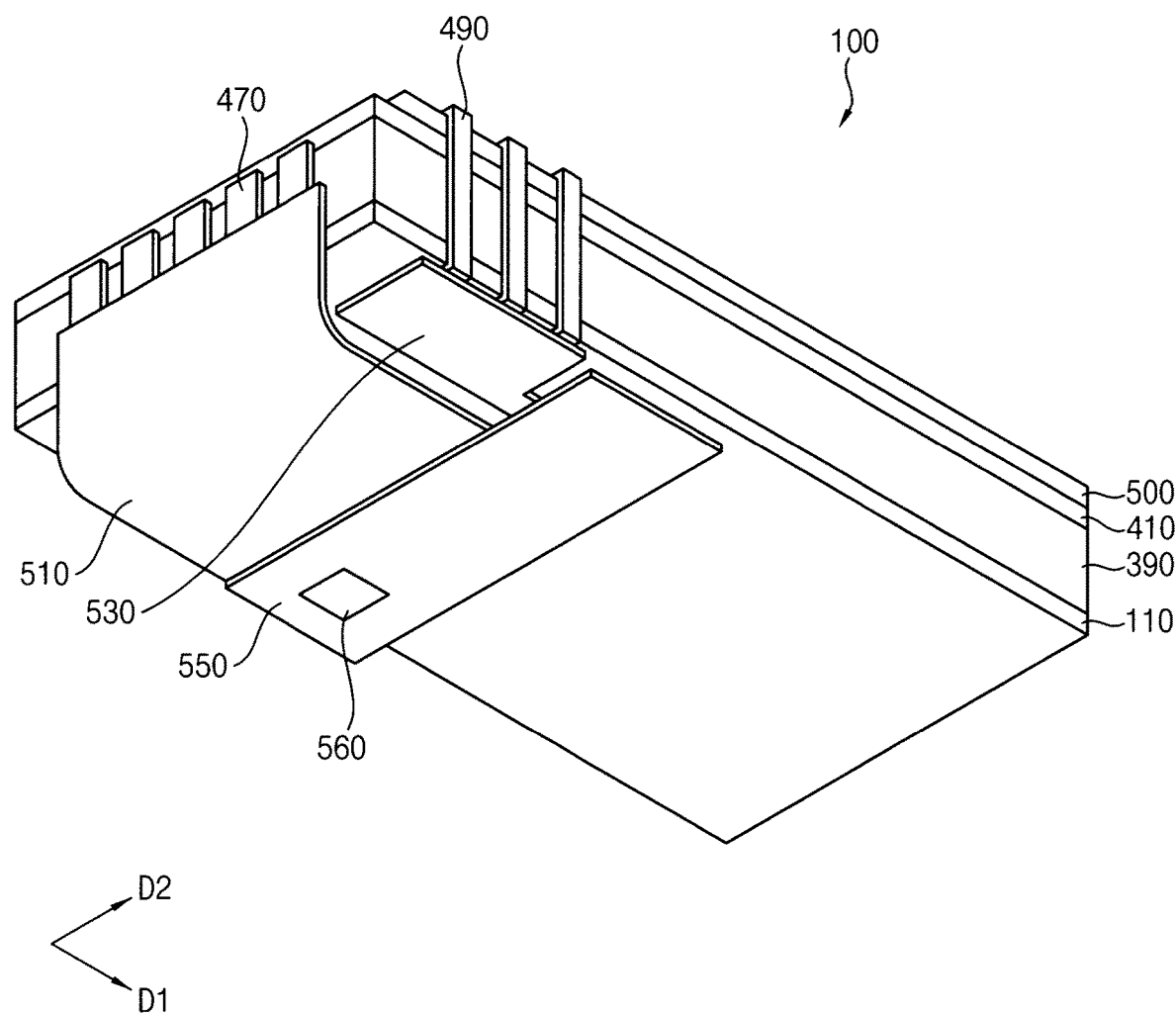
Figure 3:
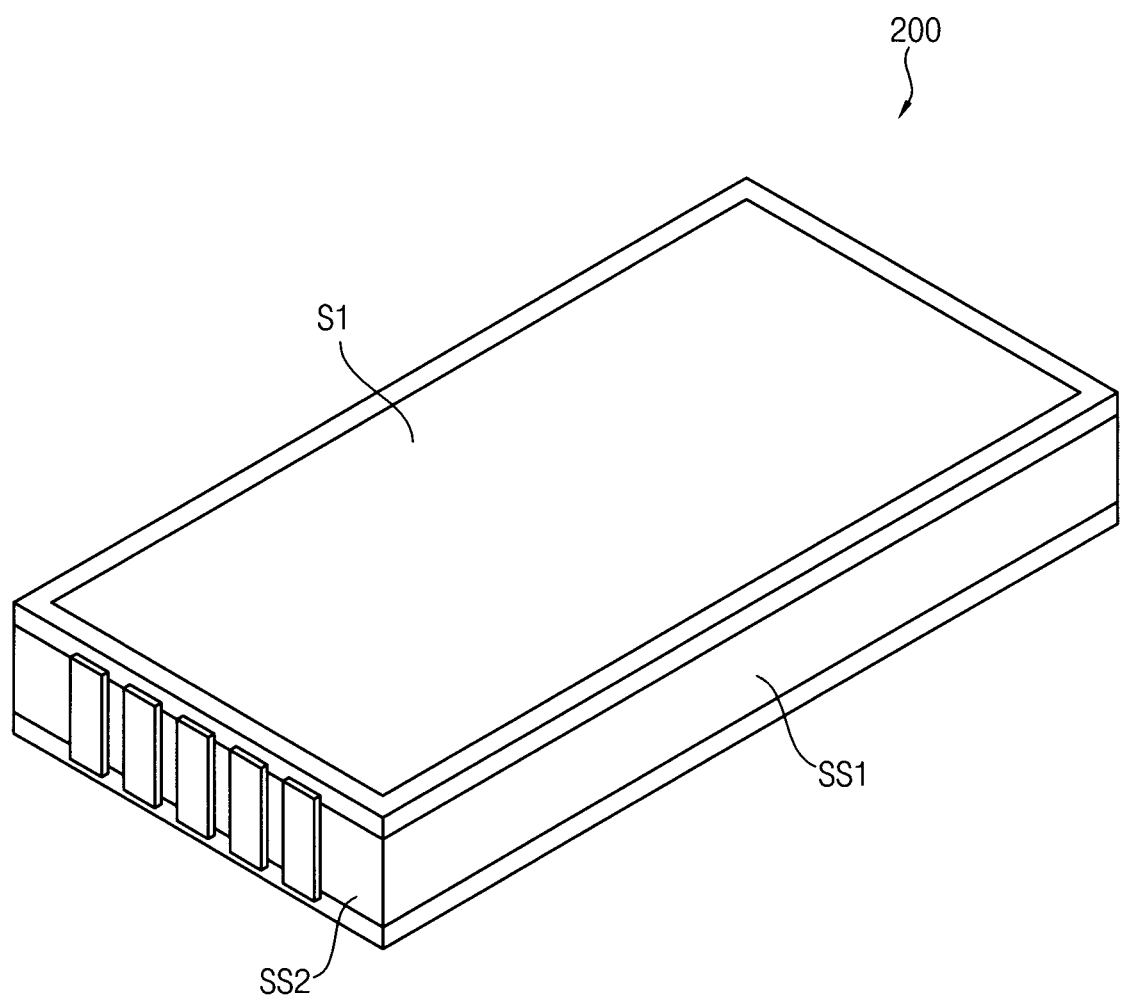
FIGS. 3 and 4 are perspective views for explaining a display panel included in the display device of FIG. 1.
Figure 4:
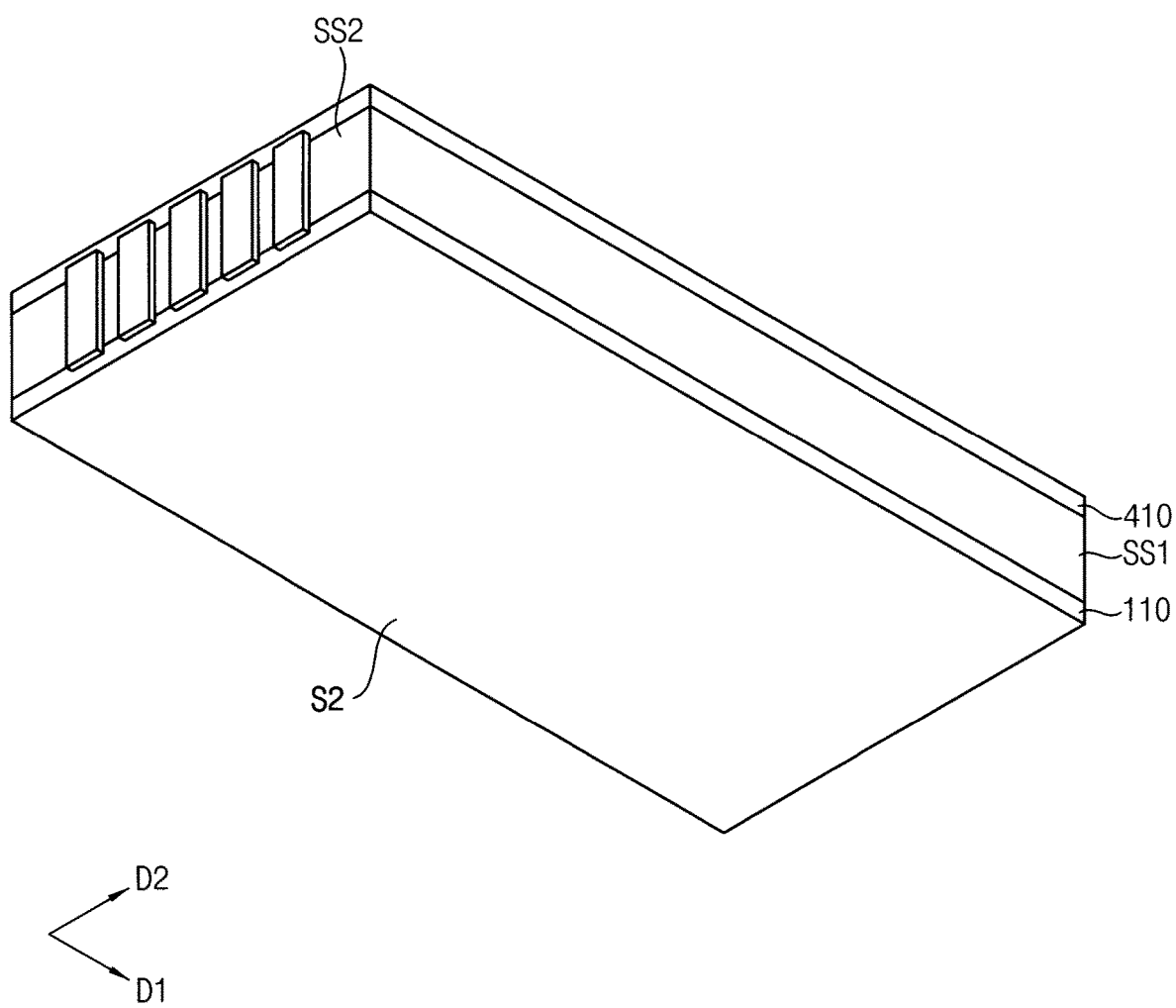
Figure 5:
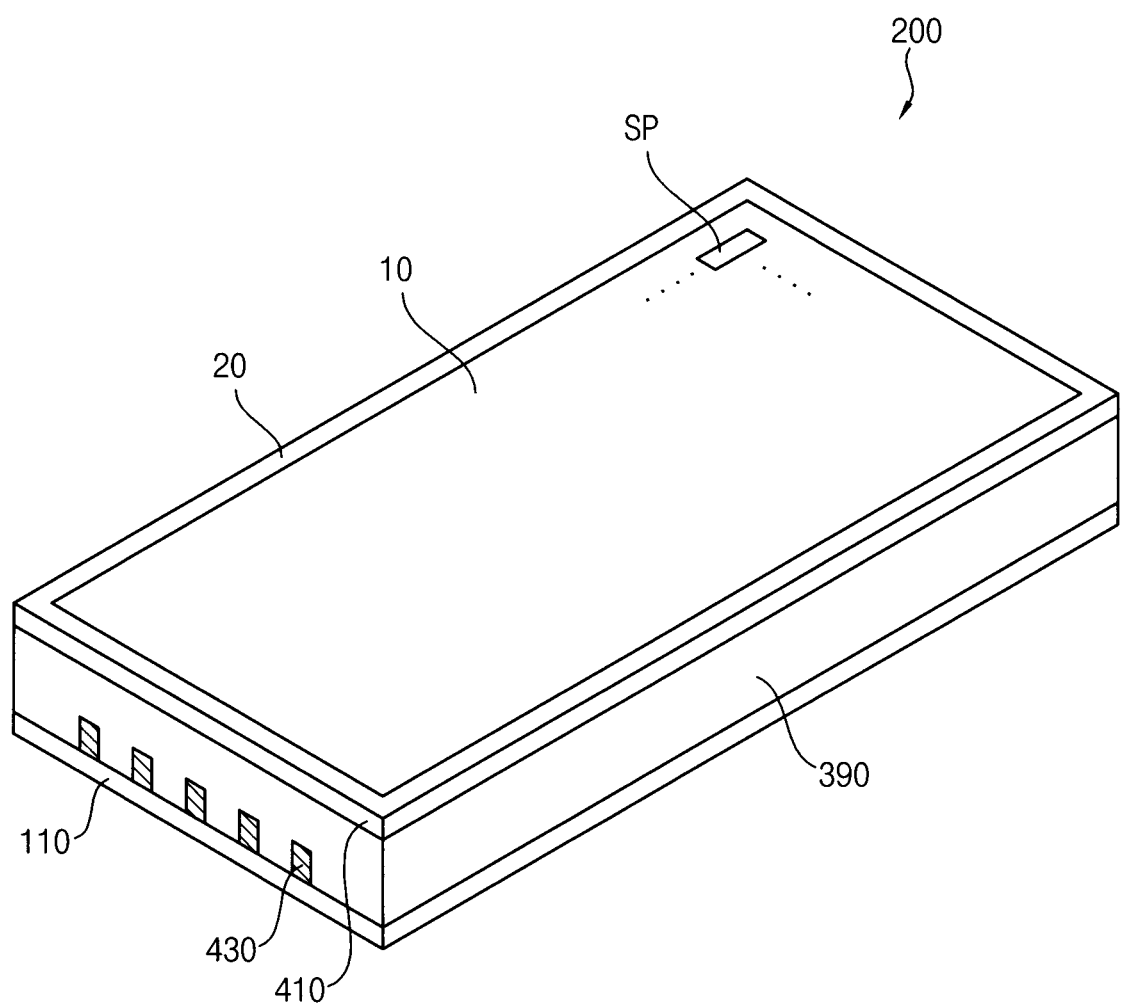
FIG. 5 is a perspective view for explaining a pad electrode included in the display panel of FIG. 3.
Figure 5:
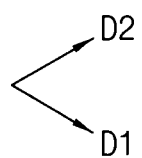

FIGS. 1 and 2 are perspective views illustrating an embodiment of a display device according to the invention. FIGS. 3 and 4 are perspective views for explaining a display panel included in the display device of FIG. 1. FIG. 5 is a perspective view for explaining a pad electrode included in the display panel of FIG. 3. In an embodiment, FIG. 1 shows a display device 100 except for a driving film 510, a sensing signal transfer film 530, and a driving circuit board 550 for convenience of description, for example.

Referring to FIGS. 1, 2, 3, 4, and 5, the display device 100 may include a display panel 200, a sensing structure 500, a side electrode 470, a side surface connection electrode structure 490, a driving film 510, a sensing signal transfer film 530, a driving circuit board 550, and the like. The display panel 200 may include a lower substrate 110, an upper substrate 410, a sealing member 390, a pad electrode 430, and the like. In addition, the driving circuit board 550 may include a driving controller 560 which generates a plurality of signals.

As shown in FIGS. 3 and 4, the display panel 200 may include a first surface S1, a second surface S2, a first side surface SS1, and a second side surface SS2. In an embodiment, the first surface S1 and the second surface S2 may face each other, for example. The first side surface SS1 and the second side surface SS2 may be adjacent to each other, and may connect the first surface S1 to the second surface S2. Selectively, the display panel 200 may further include a third side surface facing the first side surface SS1 and a fourth side surface facing the second side surface SS2.

Referring back to FIGS. 1 to 5, an image may be displayed through the first surface S1 of the display panel 200. In an embodiment, as shown in FIG. 5, the display panel 200 may include a display area 10 and a peripheral area 20 (such as a non-display area) surrounding the display area 10, in which a plurality of sub-pixels SP may be disposed in the display area 10, for example. The image may be displayed on the first surface S1 through the sub-pixels SP. Wirings (such as gate signal wiring, data signal wiring, data initialization signal wiring, initialization voltage wiring, light emission control signal wiring, and power supply voltage wiring) may be disposed in the peripheral area 20. The wirings may extend from the peripheral area 20 to the display area 10 and may be electrically connected to the sub-pixels SP.

The driving circuit board 550 may be disposed on the second surface S2 of the display panel 200. As described above, the driving circuit board 550 may include the driving controller 560. The driving controller 560 may generate an image signal and a sensing signal. The image signal may be provided to the display panel 200, and the sensing signal may be provided to the sensing structure 500. In an embodiment, the image signal may include a gate signal, a data signal, a data initialization signal, an initialization voltage, a light emission control signal, a power supply voltage, and the like, and the sensing signal may include a plurality of sensing voltages, for example. The driving circuit board 550 may partially overlap each of the driving film 510 and the sensing signal transfer film 530 on the second surface S2, and may be electrically connected in the overlapping portion. In other words, one side of the driving circuit board 550 may directly contact the sensing signal transfer film 530, and the other side of the driving circuit board 550 may directly contact the driving film 510. In an embodiment, the driving circuit board 550 may include a printed circuit board ("PCB"), a flexible printed circuit board ("FPCB"), or a flexible flat cable ("FFC"), for example. In other embodiments, the driving circuit board 550 may be connected to an external device, and the driving controller 560 may be disposed (e.g., mounted) in the external device, for example.

The sensing structure 500 may be disposed on the first surface S1 of the display panel 200. In an embodiment, the sensing structure 500 may be substantially transparent, and the image may pass through the sensing structure 500 so that the image may be visually recognized by a user of the display device 100, for example. The sensing structure 500 may include a sensing electrode. The sensing structure 500 may sense a part of a user body, an object, or the like that is disposed in front of the display device 100 through the sensing electrode. In other words, the sensing signal generated from the driving controller 560 of the driving circuit board 550 may be transferred to the sensing electrode through the sensing signal transfer film 530 and the side surface connection electrode structure 490. The driving controller 560 may receive the sensing signal transferred to the sensing electrode and sense a part of a user body, an object, or the like that is disposed in front of the display device 100. In embodiments, the sensing electrode of the sensing structure 500 may include a proximity sensor electrode which senses a proximity of the user or object positioned in front of the display device 100 or a touch sensor electrode which senses a contact of a part of the user's body. Selectively, the sensing structure 500 may further include a connection wiring for electrically connecting the sensing electrode to the side surface connection electrode structure 490.

The side surface connection electrode structure 490 may be disposed at parts of an upper surface and a side surface of the sensing structure 500 and on parts of the first side surface SS1 and the second surface S2 of the display panel 200. In an embodiment, the side surface connection electrode structure 490 may include a straight portion, a first extension portion, and a second extension portion, for example. The straight portion may be disposed on the first side surface SS1 of the display panel 200 and the side surface of the sensing structure 500. The first extension portion may be disposed on a part of the upper surface of the sensing structure 500 and may extend from a first end of the straight portion in a plane direction of the upper surface. The second extension portion may be disposed between a part of the second surface S2 of the display panel 200 and the sensing signal transfer film 530, and may extend from a second end portion opposite to the first end portion of the straight portion in a plane direction of the second surface S2. In embodiments, the first extension portion of the side surface connection electrode structure 490 may contact the sensing structure 500, and the second extension portion of the side surface connection electrode structure 490 may contact the sensing signal transfer film 530. In other words, the side surface connection electrode structure 490 may electrically connect the sensing electrode included in the sensing structure 500 to the sensing signal transfer film 530.

The side surface connection electrode structure 490 may include a metal, an alloy, metal nitride, conductive metal oxide, a transparent conductive material, or the like, for example. In an embodiment, the side surface connection electrode structure 490 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), alloys including aluminum, aluminum nitride (AlN), an alloy including silver, tungsten nitride (WN), an alloy including copper, an alloy including molybdenum, titanium nitride (TiN), chromium nitride (CrN), tantalum nitride (TaN), strontium ruthenium oxide (SrRuO), zinc oxide (ZnO), indium tin oxide ("ITO"), tin oxide (SnO), indium oxide (InO), gallium oxide (GaO), indium zinc oxide ("IZO"), and the like, for example. These may be used alone or in combination with each other. Selectively, the side surface connection electrode structure 490 may have a multi-layer structure including a plurality of layers. In embodiments, the side surface connection electrode structure 490 may include silver (Ag) or copper (Cu) having a relatively high metal adhesion and a relatively low electrical resistance.

The sensing signal transfer film 530 may be disposed on the second surface S2 of the display panel 200. One side of the sensing signal transfer film 530 may directly contact the second extension portion of the side surface connection electrode structure 490, and the other side of the sensing signal transfer film 530 may directly contact a part of the driving circuit board 550. The sensing signal transfer film 530 may include a wiring for electrically connecting the driving circuit board 550 to the side surface connection electrode structure 490 such that the sensing signal generated from the driving controller 560 of the driving circuit board 550 may be provided to the side surface connection electrode structure 490. In an embodiment, the sensing signal transfer film 530 may include a PCB, an FPCB, or an FFC, for example. Selectively, in an embodiment, a driving integrated circuit ("D-IC") may be disposed (e.g., mounted) on the sensing signal transfer film 530, for example. In other embodiments, the sensing signal transfer film 530 may not directly contact the driving circuit board 550, and may directly contact the driving film 510. In this case, the sensing signal may be transferred to the sensing signal transfer film 530 through the driving film 510.

As shown in FIG. 5, a pad electrode 430 may be disposed on the second side surface SS2 of the display panel 200. The pad electrode 430 may be disposed between the sealing member 390 and the lower substrate 110, and one surface of the pad electrode 430 may directly contact the side electrode 470. In addition, the pad electrode 430 may extend from the peripheral area 20 to the display area 10, and may be electrically connected to the sub-pixels SP. In an embodiment, the pad electrode 430 may include a metal, an alloy, metal nitride, conductive metal oxide, a transparent conductive material, or the like, for example. Selectively, the pad electrode 430 may have a multi-layer structure including a plurality of layers.

Referring back to FIGS. 1 to 5, the side electrode 470 may be disposed to overlap the pad electrode 430 on the second side surface SS2 of the display panel 200. One surface of the side electrode 470 may directly contact the pad electrode 430 and a part of the second side surface SS2, and the other surface of the side electrode 470 may directly contact a part of the driving film 510. In an embodiment, the side electrode 470 may include a metal, an alloy, metal nitride, conductive metal oxide, a transparent conductive material, or the like, for example. Selectively, in an embodiment, the side electrode 470 may have a multi-layer structure including a plurality of layers.

The driving film 510 may be disposed on the second side surface SS2 and the second surface S2 of the display panel 200. A first end portion of the driving film 510 may directly contact the side electrode 470, and a second end portion of the driving film 510 may be electrically connected to a part of the driving circuit board 550. In other words, the first end portion of the driving film 510 may be electrically connected to the side electrode 470 on the second side surface SS2, and the second end portion of the driving film 510 may be electrically connected to the driving circuit board 550 on the second surface S2. The driving film 510 may include a wiring for electrically connecting the driving circuit board 550 to the side electrode 470 such that the image signal generated from the driving controller 560 of the driving circuit board 550 may be provided to a display structure 300. Selectively, the D-IC may be disposed (e.g., mounted) on the driving film 510. In embodiments, the driving film 510 may include a PCB, an FPCB, or an FFC, for example.

A lower substrate of the conventional display device may have a size larger than that of an upper substrate, for example. The lower substrate may extend from one side of the upper substrate, and pad electrodes may be disposed in the extending portion, for example. The pad electrodes and the driving film may be bent after connected to each other, and then may be disposed on a second surface of the conventional display device. A sensing structure may be disposed on the upper substrate, and the sensing signal transfer film may be bent after connected to a part of the upper substrate, and then may be disposed on the second surface. In this case, the driving film and the sensing signal transfer film may directly contact the upper surface of the lower substrate and the upper surface of the upper substrate, and thus bent portions of the driving film and the sensing signal transfer film may be present. Accordingly, the bent portions may be a dead space.

In embodiments of the invention, the display device 100 may include a side electrode 470 and a side surface connection electrode structure 490. When the driving film 510 is connected to the side electrode 470 at the second side surface SS2 of the display panel 200, a bending radius of the driving film 510 may be relatively reduced. In addition, when the sensing signal transfer film 530 is connected to the side surface connection electrode structure 490 at the second surface S2 of the display panel 200, the sensing signal transfer film 530 may not be bent. Accordingly, the display device 100 may function as a display device having a relatively reduced dead space.

Figure 6:
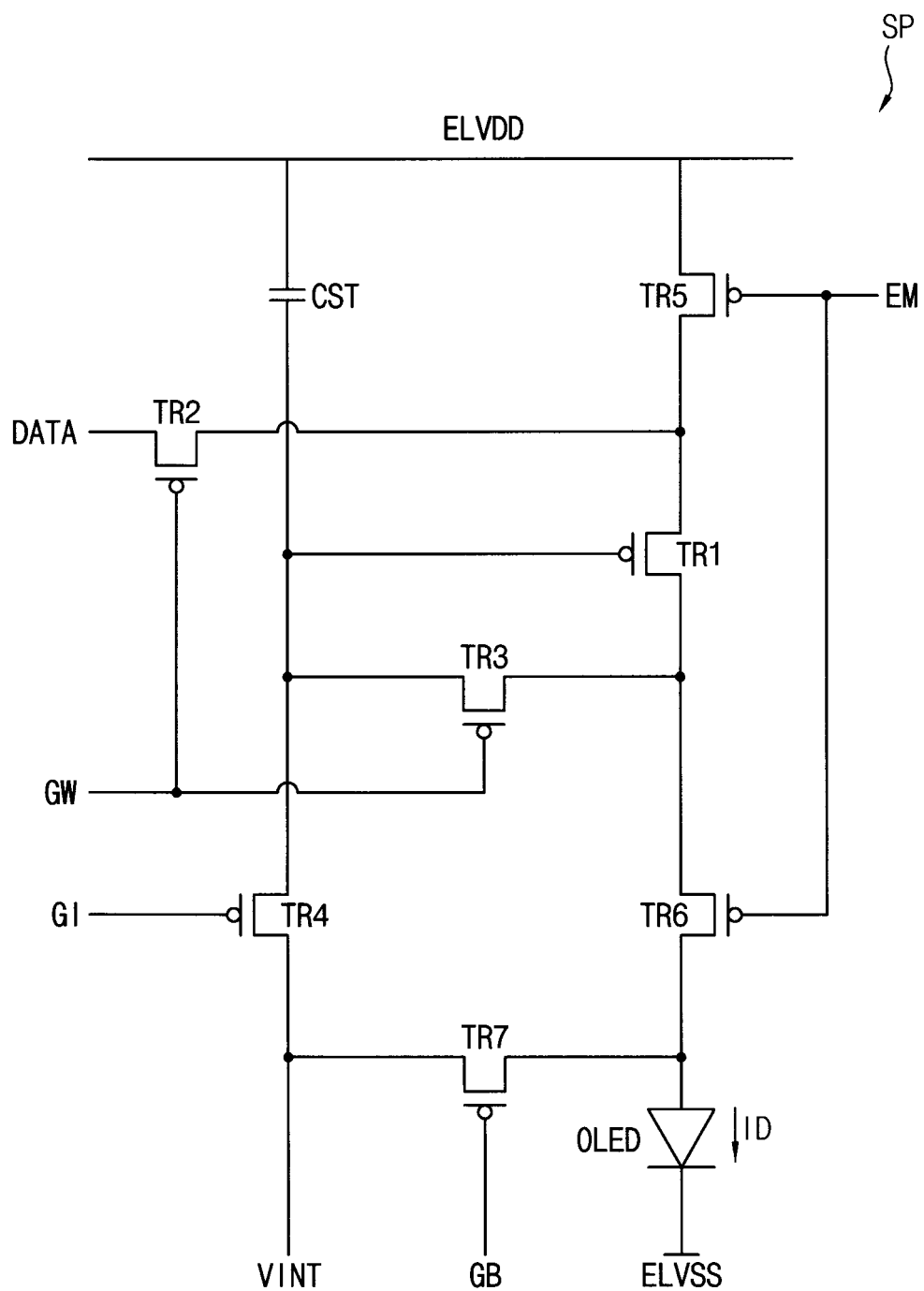
FIG. 6 is a circuit diagram illustrating a sub-pixel included in the display panel of FIG. 5.

FIG. 6 is a circuit diagram illustrating a sub-pixel included in the display panel of FIG. 5. In an embodiment, the display device 100 may include a plurality of sub-pixels SP, and each of the sub-pixels SP may correspond to the circuit shown in FIG. 6, for example.

Referring to FIG. 6, the display device 100 may include an organic light emitting diode OLED (such as a display structure 300 of FIG. 10), first to seventh transistors TR1, TR2, TR3, TR4, TR5, TR6, and TR7 (such as a semiconductor element 250 of FIG. 10), a storage capacitor CST, a gate signal wiring for transmitting a gate signal GW, a data signal wiring for transmitting a data signal DATA, a high power supply voltage wiring for transmitting a high power supply voltage ELVDD, a low power supply voltage wiring for transmitting a low power supply voltage wiring ELVSS, an initialization signal wiring for transmitting an initialization signal GI, an initialization voltage wiring for transmitting an initialization voltage VINT, a light emission control signal wiring for transmitting a light emission control signal EM, and the like. Each of the first to seventh transistors TR1, TR2, TR3, TR4, TR5, TR6, and TR7 may include a first terminal, a second terminal, a channel, and a gate terminal. In embodiments, the first terminal may be a source terminal and the second terminal may be a drain terminal. Selectively, the first terminal may be a drain terminal, and the second terminal may be a source terminal.

The organic light emitting diode OLED may output light based on a driving current ID. The organic light emitting diode OLED may include the first terminal and the second terminal. In embodiments, the second terminal of the organic light emitting diode OLED may be supplied with the low power supply voltage ELVSS. The low power supply voltage ELVSS may be generated from the driving controller 560 of the driving circuit board 550, and may be provided to the side electrode 470 through the driving film 510 (refer to FIG. 1). In other words, the low power supply voltage ELVSS may be provided to the low power supply voltage wiring through the pad electrode 430 contacting the side electrode 470, and the low power supply voltage ELVSS applied to the low power supply voltage wiring may be provided to a second terminal of the organic light emitting diode OLED. In an embodiment, the first terminal of the organic light emitting diode OLED may be an anode terminal, and the second terminal of the organic light emitting diode OLED may be a cathode terminal, for example. Selectively, the first terminal of the organic light emitting diode OLED may be a cathode terminal, and the second terminal of the organic light emitting diode OLED may be an anode terminal. In embodiments, the anode terminal of the organic light emitting diode OLED may correspond to the lower electrode 290 in FIG. 10, and the cathode terminal of the organic light emitting diode OLED may correspond to the upper electrode 340 in FIG. 10.

The first transistor TR1 may generate the driving current ID. In embodiments, the first transistor TR1 may operate in a saturation area. In this case, the first transistor TR1 may generate the driving current ID based on a voltage difference between the gate terminal and the source terminal. In addition, a tone wedge may be expressed based on a size of the driving current ID supplied to the organic light emitting diode OLED. Selectively, the first transistor TR1 may operate in a linear area. In this case, a tone wedge may be expressed based on the sum of time lengths for supplying the driving current to the organic light emitting diode OLED within one frame.

The gate terminal of the second transistor TR2 may be supplied with the gate signal GW. The first terminal of the second transistor TR2 may be supplied with the data signal DATA. The second terminal of the second transistor TR2 may be connected to the first terminal of the first transistor TR1. The second transistor TR2 may supply the data signal DATA to the first terminal of the first transistor TR1 during an activation period of the gate signal GW. In this case, the second transistor TR2 may operate in the linear area.

The gate terminal of the third transistor TR33 may be supplied with the gate signal GW. The first terminal of the third transistor TR3 may be connected to the gate terminal of the first transistor TR1. The second terminal of the third transistor TR3 may be connected to the second terminal of the first transistor TR1. The third transistor TR3 may connect the gate terminal of the first transistor TR1 to the second terminal of the first transistor TR1 during an activation period of the gate signal GW. In this case, the third transistor TR3 may operate in the linear area. In other words, the third transistor TR3 may diode-connect the first transistor TR1 during an activation period of the gate signal GW.

An input terminal of the initialization voltage wiring provided with the initialization voltage VINT may be connected to the first terminal of the fourth transistor TR4 and the first terminal of the seventh transistor TR7, and an output terminal of the initialization voltage wiring may be connected to the second terminal of the fourth transistor TR4 and the first terminal of the storage capacitor CST.

The gate terminal of the fourth transistor TR4 may be supplied with the gate initialization signal GI. The first terminal of the fourth transistor TR4 may be supplied with the initialization voltage VINT. The second terminal of the fourth transistor TR4 may be connected to the gate terminal of the first transistor TR1. The fourth transistor TR4 may supply the initialization voltage VINT to the gate terminal of the first transistor TR1 during an activation period of the gate initialization signal GI. In this case, the fourth transistor TR4 may operate in the linear area. In other words, the fourth transistor TR4 may initialize the gate terminal of the first transistor TR1 into the initialization voltage VINT during an activation period of the gate initialization signal GI.

The gate terminal of the fifth transistor TR5 may be supplied with a light emission control signal EM. The first terminal of the fifth transistor TR5 may be connected to the high power supply voltage wiring. The second terminal of the fifth transistor TR5 may be connected to the first terminal of the first transistor TR1. In an embodiment, the light emission control signal may be provided from a light emission control driving unit, and the light emission control signal EM may be applied to the gate terminal of the fifth transistor TR5 through the light emission control signal wiring, for example. The fifth transistor TR5 may supply the high power supply voltage ELVDD to the first terminal of the first transistor TR1 during an activation period of the light emission control signal EM. On the contrary, the fifth transistor TR5 may block the supply of the high power supply voltage ELVDD during an inactivation period of the light emission control signal EM. In this case, the fifth transistor TR5 may operate in the linear area. The fifth transistor TR5 may supply the high power supply voltage ELVDD to the first terminal of the first transistor TR1 during the activation period of the light emission control signal EM, so that the first transistor TR1 may generate the driving current ID. In addition, the fifth transistor TR5 may block the supply of the high power supply voltage ELVDD during the inactivation period of the light emission control signal EM, so that the data signal DATA supplied to the first terminal of the first transistor TR1 may be supplied to the gate terminal of the first transistor TR1.

The gate terminal of the sixth transistor TR6 (such as the semiconductor element 250 in FIG. 10) may be supplied with the light emission control signal EM. The first terminal of the sixth transistor TR6 may be connected to the second terminal of the first transistor TR1. The second terminal of the sixth transistor TR6 may be connected to the first terminal of the organic light emitting diode OLED. The sixth transistor TR6 may supply the driving current ID generated by the first transistor TR1 to the organic light emitting diode OLED during the activation period of the light emission control signal EM. In this case, the sixth transistor TR6 may operate in the linear area. In other words, the sixth transistor TR6 may supply the driving current ID generated by the first transistor TR1 to the organic light emitting diode OLED during the activation period of the light emission control signal EM, so that the organic light emitting diode OLED may output light. In addition, the sixth transistor TR6 electrically isolates the first transistor TR1 and the organic light emitting diode OLED from each other during the inactivation period of the light emission control signal EM, so that the data signal DATA supplied to the second terminal of the first transistor TR1 may be supplied to the gate terminal of the first transistor TR1.

The gate terminal of the seventh transistor TR7 may supplied with a diode initialization signal GB. The first terminal of the seventh transistor TR7 may be supplied with the initialization voltage VINT. The second terminal of the seventh transistor TR7 may be connected to the first terminal of the organic light emitting diode OLED. The seventh transistor TR7 may supply the initialization voltage VINT to the first terminal of the organic light emitting diode OLED during the activation period of the diode initialization signal GB. In this case, the seventh transistor TR7 may operate in the linear area. In other words, the seventh transistor TR7 may initialize the first terminal of the organic light emitting diode OLED into the initialization voltage VINT during an activation period of the diode initialization signal GB.

The storage capacitor CST may include a first terminal and a second terminal. The storage capacitor CST may be connected between the high power supply voltage wiring and the gate terminal of the first transistor TR1. In an embodiment, the first terminal of the storage capacitor CST may be connected to the gate terminal of the first transistor TR1, and the second terminal of the storage capacitor CST may be connected to the high power supply voltage wiring, for example. The storage capacitor CST may maintain a voltage level of the gate terminal of the first transistor TR1 during an inactivation period of the gate signal GW. The inactivation period of the gate signal GW may include an activation period of the light emission control signal EM, and a driving current ID generated by the first transistor TR1 during the activation period of the light emission control signal EM may be supplied to the organic light emitting diode OLED. Accordingly, the driving current ID generated by the first transistor TR1 may be supplied to the organic light emitting diode OLED, based on the voltage level maintained by the storage capacitor CST.

Although an embodiment of one sub-pixel SP according to the invention has been described as including seven transistors and one storage capacitor, the configuration of the invention is not limited thereto. In an embodiment, the one sub-pixel SP may include at least one transistor and at least one storage capacitor, for example.

Figure 7:
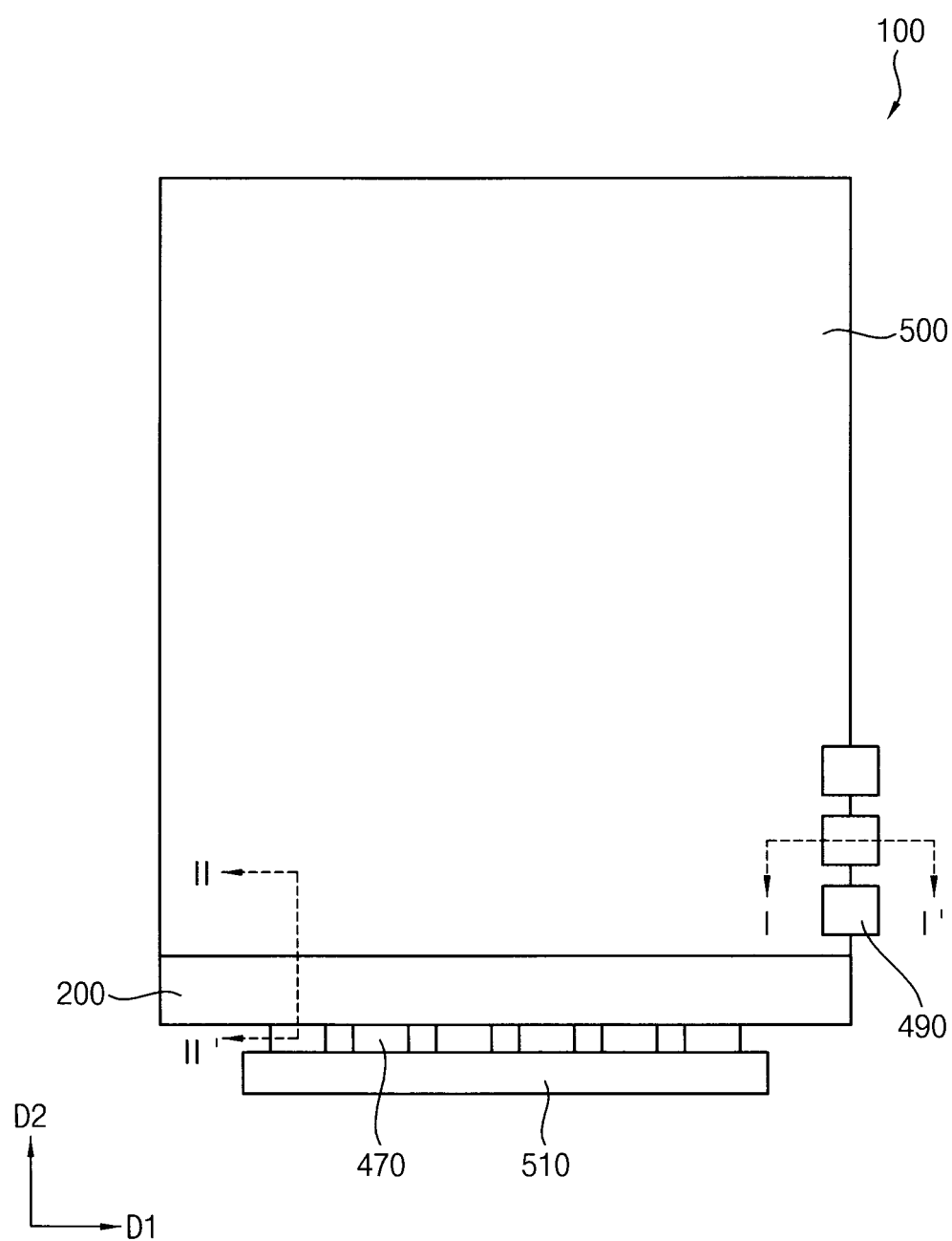
FIGS. 7 and 8 are a plan view showing the display device of FIG. 1.
Figure 8:
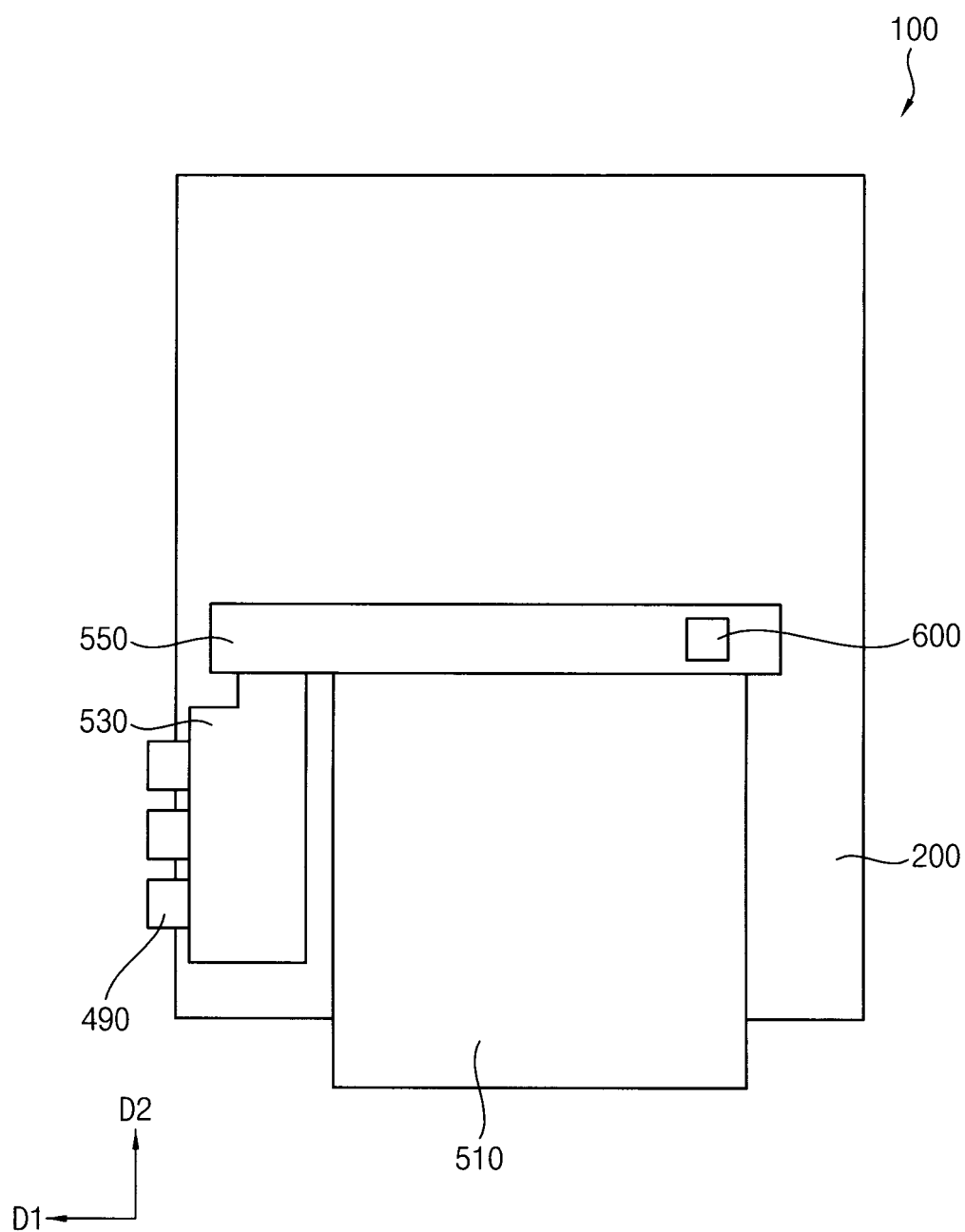
Figure 9:
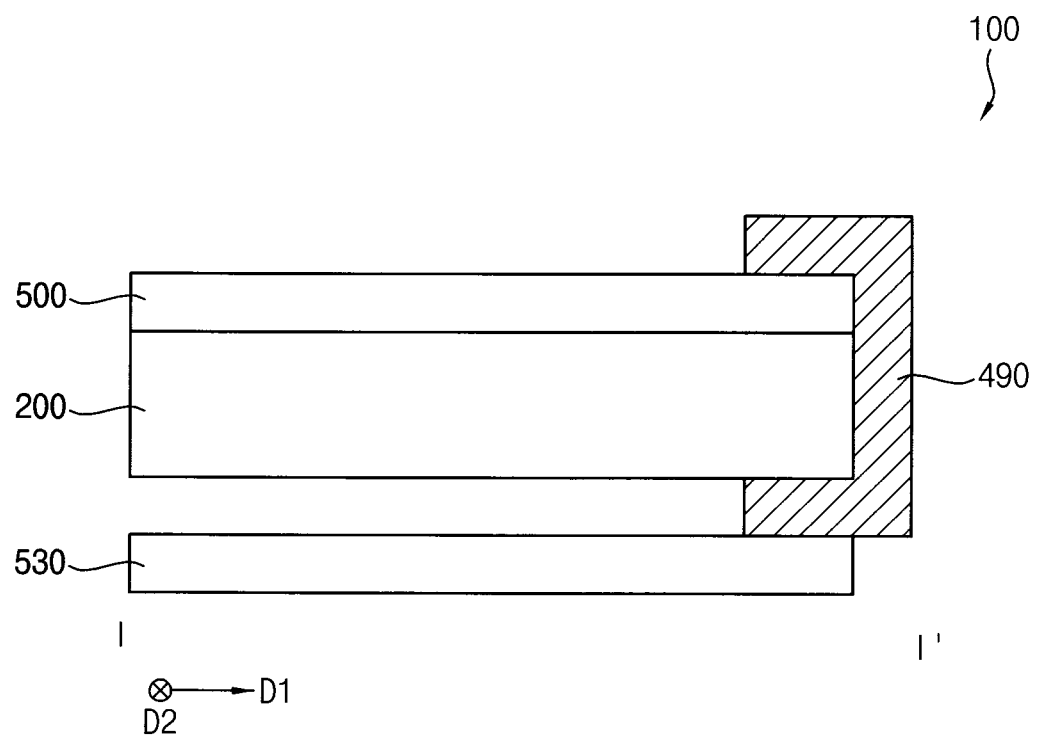
FIG. 9 is a cross-sectional view taken along line I-I' of FIG. 7.
Figure 10:
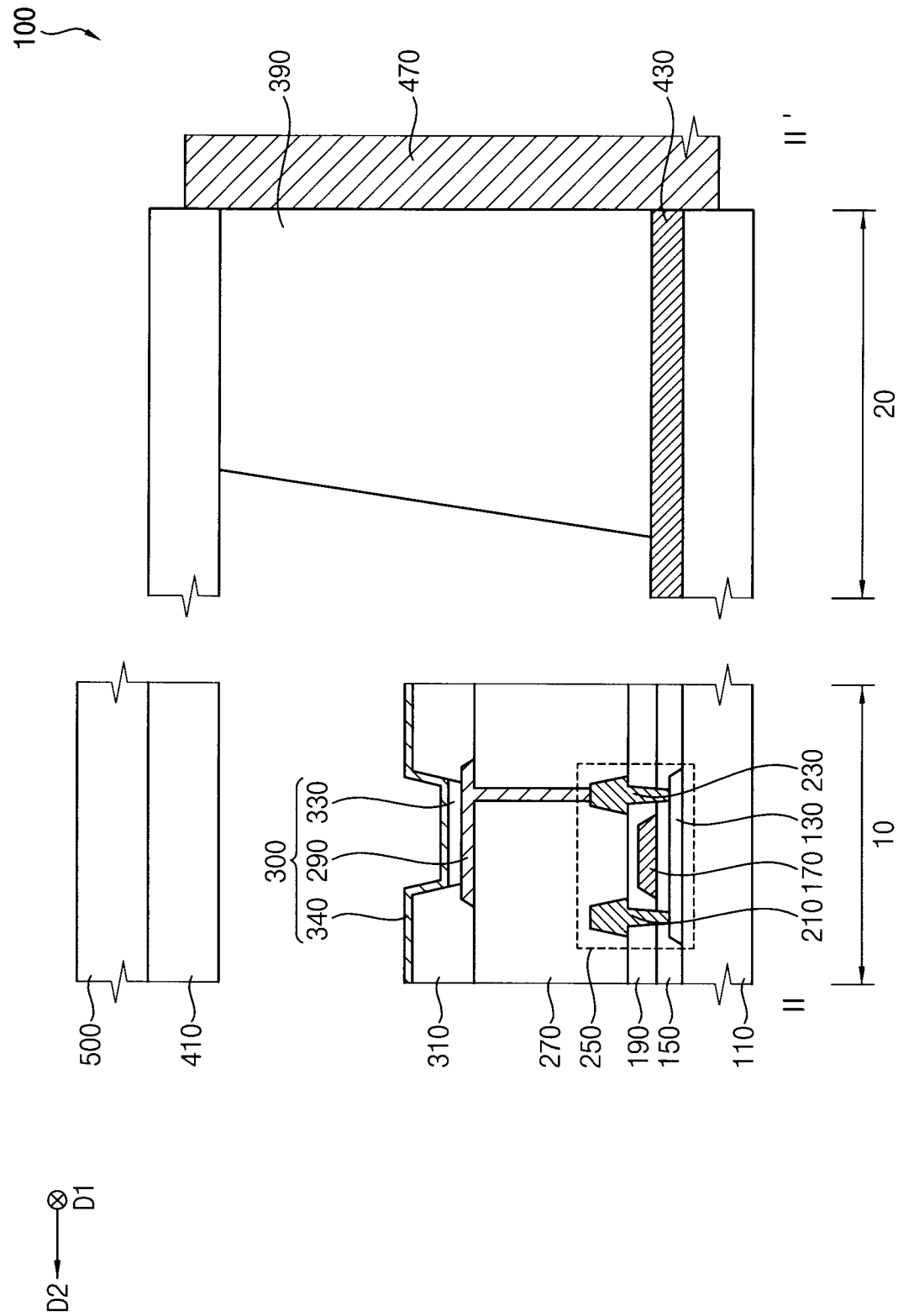
FIG. 10 is a cross-sectional view taken along line of FIG. 7.
Figure 11:
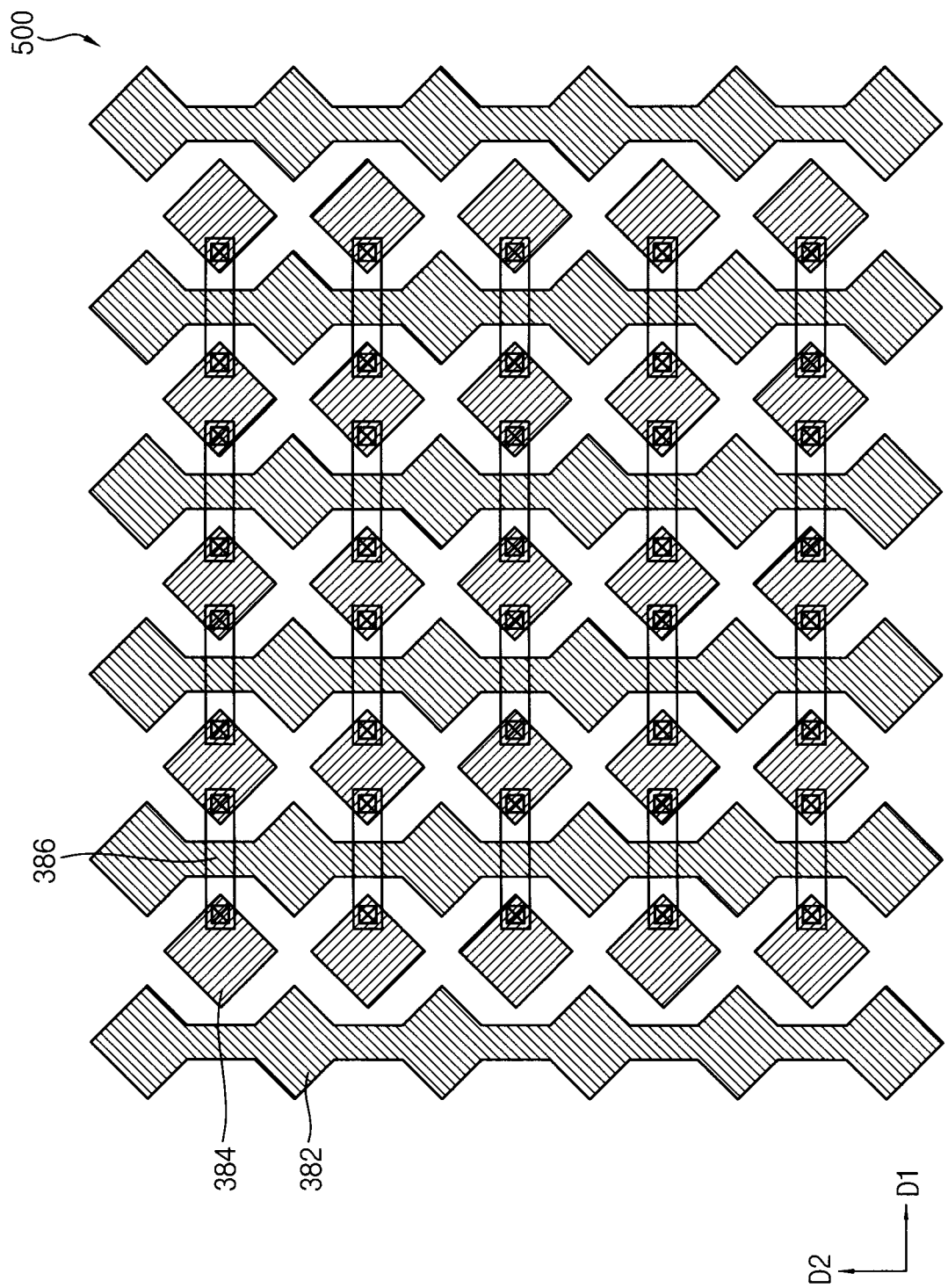
FIG. 11 is a plan view illustrating a sensing structure included in the display device of FIG. 10.

FIGS. 7 and 8 are a plan view showing the display device of FIG. 1. FIG. 9 is a cross-sectional view taken along line I-I' of FIG. 7. FIG. 10 is a cross-sectional view taken along line II-II' of FIG. 7. FIG. 11 is a plan view illustrating a sensing structure included in the display device of FIG. 10.

The display device 100 may include a display panel 200, a sensing structure 500, a side electrode 470, a side surface connection electrode structure 490, a driving film 510, a sensing signal transfer film 530, a driving circuit board 550, and the like. The display panel 200 may include a lower substrate 110, a semiconductor element 250, a pad electrode 430, a planarization layer 270, a pixel defining layer 310, a display structure 300, a sealing member 390, and an upper substrate 410. In addition, the semiconductor element 250 may include an active layer 130, a gate insulating layer 150, a gate electrode 170, an interlayer insulating layer 190, a source electrode 210, and a drain electrode 230, and the display structure 300 may include a lower electrode 290, a light emitting layer 330, and an upper electrode 340. In addition, the driving circuit board 550 may include the driving controller 560.

As described above, when the display panel 200 includes the display area 10 and the peripheral area 20, the lower substrate 110 may also be divided into a display area 10 and a peripheral area 20.

Although the display area 10 and the peripheral area 20 shown in FIG. 5 have been described as having a rectangular plane shape, the shapes of the display area 10 and the peripheral area 20 are not limited thereto. In other embodiments, each of the display area 10 and the peripheral area 20 may have various other shapes such as a triangular plane shape, a rhombus plane shape, a polygonal plane shape, a circular plane shape, a track plane shape, or an oval plane shape.

Referring to FIGS. 7, 8, 9, and 10, the lower substrate 110 may include a transparent or opaque material. In an embodiment, the lower substrate 110 may include a quartz substrate, a synthetic quartz substrate, a calcium fluoride substrate, a fluorine-doped (F-doped) quartz substrate, a sodalime glass substrate, a non-alkali glass substrate, and the like, for example.

Selectively, the lower substrate 110 may include a transparent resin substrate having flexibility. An embodiment of the transparent resin substrate that may be used for the lower substrate 110 includes a polyimide substrate. In this case, the polyimide substrate may include a first polyimide layer, a barrier film layer, a second polyimide layer, and the like, for example. In an embodiment, the polyimide substrate may have a configuration in which a first polyimide layer, a barrier film layer, and a second polyimide layer are sequentially laminated on a hard glass substrate. In the method of manufacturing the display device 100, after the insulating layer (such as the buffer layer) is disposed on the second polyimide layer of the polyimide substrate, an upper structure (such as the semiconductor element 250 or the display structure 300) may be disposed on the insulating layer, for example. After the upper structure is provided, the hard glass substrate may be removed. In other words, since the polyimide substrate is thin and flexible, it may be difficult to directly provide the upper structure on the polyimide substrate. Considering the above difficulty, the upper structure is provided using the hard glass substrate, and then the glass substrate is removed, so that the polyimide substrate may be used as the lower substrate 110.

A buffer layer (not shown) may be disposed on the lower substrate 110. The buffer layer may be disposed entirely on the lower substrate 110. The buffer layer may prevent metal atoms or impurities from diffusing from the lower substrate 110 to the semiconductor element 250 and the pixel structure of the display panel 200, and may enable a substantially uniform active layer 130 to be obtained by adjusting the rate of heat transfer during crystallization process for forming the active layer 130. In addition, when the surface of the lower substrate 110 is not uniform, the buffer layer may serve to improve the flatness of the surface of the lower substrate 110. Depending on a type of the lower substrate 110, at least two buffer layers may be provided on the lower substrate 110, or the buffer layer may not be disposed thereon. In an embodiment, the buffer layer may include an organic material or an inorganic material, for example.

In an embodiment, the active layer 130 may be disposed in the display area 10 on the lower substrate 110, and may include a metal oxide semiconductor, an inorganic semiconductor (such as amorphous silicon or poly silicon), an organic semiconductor, or the like. The active layer 130 may include a channel area, a source area and a drain area.

The gate insulating layer 150 may be disposed on the active layer 130. The gate insulating layer 150 may cover the active layer 130 in the display area 10 on the lower substrate 110, and may be disposed entirely in the display area 10 on the lower substrate 110. In embodiments, the gate insulating layer 150 may not be disposed in the peripheral area 20 on the lower substrate 110. In other embodiments, the gate insulating layer 150 may be disposed entirely in the display area 10 and the peripheral area 20 on the lower substrate 110. The gate insulating layer 150 may sufficiently cover the active layer 130 on the lower substrate 110, and may include a substantially planar upper surface without generating a step around the active layer 130. Selectively, the gate insulating layer 150 may be disposed to have a uniform thickness along a profile of the active layer 130 while covering the active layer 130 on the lower substrate 110. The gate insulating layer 150 may include silicon compound, metal oxide, or the like. In an embodiment, the gate insulating layer 150 may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), and the like, for example.

The gate electrode 170 may be disposed on a portion of the gate insulating layer 150 below which the active layer 130 is disposed (such as the channel area of the active layer 130). In an embodiment, the gate electrode 170 may include a metal, an alloy, metal nitride, conductive metal oxide, a transparent conductive material, or the like, for example. These may be used alone or in combination with each other. Selectively, the gate electrode 170 may have a multi-layer structure including a plurality of layers.

An interlayer insulating layer 190 may be disposed on the gate electrode 170. The interlayer insulating layer 190 may cover the gate electrode 170 in the display area 10 on the gate insulating layer 150, and may be disposed entirely on the gate insulating layer 150. In embodiments, the interlayer insulating layer 190 may not be disposed in the peripheral area 20 on the lower substrate 110. In other embodiments, the gate insulating layer 150 may be disposed entirely in the display area 10 and the peripheral area 20 on the lower substrate 110. The interlayer insulating layer 190 may sufficiently cover the gate electrode 170 on the gate insulating layer 150, and may include a substantially planar upper surface without generating a step around the gate electrode 170. Selectively, the interlayer insulating layer 190 may be disposed to have a uniform thickness along a profile of the gate electrode 170 while covering the gate electrode 170 on the gate insulating layer 150. In an embodiment, the interlayer insulating layer 190 may include silicon compound, metal oxide, or the like, for example.

The source electrode 210 and the drain electrode 230 may be disposed in the display area 10 on the interlayer insulating layer 190. The source electrode 210 may be connected to the source area of the active layer 130 through a contact hole defined by removing a first portion of the gate insulating layer 150 and the interlayer insulating layer 190, and the drain electrode 230 may be connected to the drain area of the active layer 130 through a contact hole defined by removing a second portion of the gate insulating layer 150 and the interlayer insulating layer 190. In an embodiment, each of the source electrode 210 and the drain electrode 230 may include a metal, an alloy, metal nitride, conductive metal oxide, a transparent conductive material, or the like, for example. These may be used alone or in combination with each other. Selectively, each of the source electrode 210 and the drain electrode 230 may have a multi-layer structure including a plurality of layers.

Accordingly, a semiconductor element 250 including the active layer 130, the gate insulating layer 150, the gate electrode 170, the interlayer insulating layer 190, the source electrode 210, and the drain electrode 230 may be disposed.

Although the display device 100 has been described as including one transistor (such as the semiconductor element 250), the configuration of the invention is not limited thereto. In an embodiment, the display device 100 may include at least two transistors and at least one capacitor, for example.

In addition, although the semiconductor element 250 has been described as having an upper gate structure, the configuration of the invention is not limited thereto. In an embodiment, the semiconductor element 250 may have a bottom gate structure and/or a double gate structure, for example.

The pad electrode 430 may be disposed in the peripheral area 20 on the lower substrate 110. A first portion of the pad electrode (such as the one side) may be aligned on an outermost surface of the display device 100, and a second portion opposite to the first portion of the pad electrode 430 may extend in a direction to the display area 10 from the peripheral area 20. In an embodiment, the second portion of the pad electrode 430 may be connected to one of the gate signal wiring, data signal wiring, power supply voltage wiring, initialization signal wiring, initialization voltage wiring, and light emission control signal wiring, for example. In other words, one of the gate signal wiring, data signal wiring, power supply voltage wiring, initialization signal wiring, initialization voltage wiring, and light emission control signal wiring that are generated from the driving controller 560 of the driving circuit board 550 may be transferred to the display structure 300 through the driving film 510, side electrode 470 and the pad electrode 430. In an embodiment, the pad electrode 430 may include a metal, an alloy, metal nitride, conductive metal oxide, a transparent conductive material, or the like, for example. In embodiments, the pad electrode 430 and the source and drain electrodes 210 and 230 may be simultaneously provided using the same material. Selectively, the pad electrode 430 may have a multi-layer structure including a plurality of layers.

The planarization layer 270 may be disposed in the display area 10 on the interlayer insulating layer 190, the source electrode 210, and the drain electrode 230. In an embodiment, the planarization layer 270 may be relatively thickly provided to sufficiently cover the source and drain electrodes 210 and 230 on the interlayer insulating layer 190, for example. In this case, the planarization layer 270 may include a substantially planar upper surface, and a planarization process may be added to the planarization layer 270 to implement the above planar upper surface of the planarization layer 270. A part of the top surface of the drain electrode 230 may be exposed through the contact hole defined by removing a part of the planarization layer 270. The planarization layer 270 may include an organic material or an inorganic material. In embodiments, the planarization layer 270 may include an organic material. In an embodiment, the planarization layer 270 may include photoresist, polyacryl-based resin, polyimide-based resin, polyamide-based resin, siloxane-based resin, acryl-based resin, epoxy-based resin, and the like, for example.

The lower electrode 290 may be disposed in the display area 10 on the planarization layer 270. The lower electrode 290 may be connected to the drain electrode 230 after passing through the contact hole of the planarization layer 270. In addition, the lower electrode 290 may be electrically connected to the semiconductor element 250. In an embodiment, the lower electrode 290 may include a metal, an alloy, metal nitride, conductive metal oxide, a transparent conductive material, or the like, for example. These may be used alone or in combination with each other. Selectively, the lower electrode 290 may have a multi-layer structure including a plurality of layers.

The pixel defining layer 310 may be disposed in the display area 10 on the planarization layer 270 and a portion of the lower electrode 290. The pixel defining layer 310 may cover both sides of the lower electrode 290, and may expose a part of the top surface of the lower electrode 290. The pixel defining layer 310 may include an organic material or an inorganic material. In embodiments, the pixel defining layer 310 may include an organic material.

The light emitting layer 330 may be disposed in the display area 10 on the lower electrode 290 exposed by the pixel defining layer 310. The light emitting layer 330 may be provided using at least one of light emitting materials capable of emitting color lights (such as red light, green light, and blue light) that are different according to the sub-pixel. On the contrary, the light emitting layer 330 may be provided by laminating a plurality of light emitting materials capable of generating different color lights such as red light, green light and blue light, such that white light may be entirely emitted. In this case, a color filter may be disposed on the light emitting layer 330 (for example, the color filter may overlap the light emitting layer 330 on a bottom or top surface of the upper substrate 410). In an embodiment, the color filter may include at least one of a red color filter, a green color filter, and a blue color filter, for example. Selectively, in an embodiment, the color filter also may include a yellow color filter, a cyan color filter, and a magenta color filter, for example. The color filter may include photosensitive resin or color photoresist.

The upper electrode 340 may be disposed in the display area 10 on the pixel defining layer 310 and the light emitting layer 330. In an embodiment, the upper electrode 340 may include a metal, an alloy, metal nitride, conductive metal oxide, a transparent conductive material, or the like, for example. These may be used alone or in combination with each other. Selectively, the upper electrode 340 may have a multi-layer structure including a plurality of layers.

Accordingly, the display structure 300 including the lower electrode 290, the light emitting layer 330, and the upper electrode 340 may be disposed.

The sealing member 390 may be disposed in the peripheral area 20 on the pad electrode 430. In other words, the sealing member 390 may be disposed in the peripheral area 20 between the lower substrate 110 and the upper substrate 410. The top surface of the sealing member 390 may directly contact the bottom surface of the upper substrate 410, and the bottom surface of the sealing member 390 may directly contact the pad electrode 430. In embodiments, a first portion (such as the one side) of the sealing member 390 may be aligned on an outermost surface of the display device 100, and a second portion opposite to the first portion of the sealing member 390 may be disposed inside the display device 100. The sealing member 390 may include a frit or the like. In addition, the sealing member 390 may further include a photocurable material. In an embodiment, the sealing member 390 may include a combination of an organic material and a photocurable material, and the sealing member 390 may be obtained by irradiating the combination with ultraviolet rays ("UV"), laser light, visible light, or the like and then curing the combination, for example. In an embodiment, the photocurable material included in the sealing member 390 may include epoxy acrylate-based resin, polyester acrylate-based resin, urethane acrylate-based resin, polybutadiene acrylate-based resin, silicone acrylate-based resin, alkyl acrylate-based resin, and the like, for example.

In an embodiment, the combination of the organic material and the photocurable material may be irradiated with laser light, for example. Upon the irradiation of laser light, the combination may be changed from a solid state to a liquid state, and the combination in the liquid state may be cured in the solid state after a predetermined time. The upper substrate 410 may be sealed and coupled to the lower substrate 110 according to the state change of the combination.

Although the sealing member 390 has been described as having a rectangular shape in which a width of the top surface is smaller than a width of the bottom surface, the configuration of the invention is not limited thereto. In an embodiment, the sealing member 390 may have a rectangular shape having the width of the top surface greater than the width of the bottom surface, a trapezoidal shape, a rectangular shape, a square shape, or the like, for example.

The upper substrate 410 may be disposed on the sealing member 390 and the upper electrode 340. In embodiments, the upper substrate 410 and the lower substrate 110 may have substantially the same size and may overlap each other. The upper substrate 410 may include substantially the same material as that of the lower substrate 110. In an embodiment, the upper substrate 410 may include a quartz substrate, a synthetic quartz substrate, a calcium fluoride substrate, a fluorine-doped (F-doped) quartz substrate, a sodalime glass substrate, a non-alkali glass substrate, and the like, for example.

In other embodiments, the upper substrate 410 may include a transparent inorganic material or flexible plastic. In an embodiment, the upper substrate 410 may include a transparent resin substrate having flexibility. In this case, at least one inorganic layer and at least one organic layer may be alternately laminated in order to improve the flexibility of the organic light emitting diode display device 100, for example. The laminated structure may include a first inorganic layer, an organic layer, and a second inorganic layer. In an embodiment, a first inorganic layer having flexibility may be disposed along a profile of the upper electrode 340, an organic layer having flexibility may be disposed on the first inorganic layer, and a second inorganic layer having flexibility may be disposed on the organic layer, for example. In other words, the laminated structure may correspond to a thin film encapsulation structure directly contacting the upper electrode 340.

The sensing structure 500 may be disposed in the display area 10 on the upper substrate 410. In embodiments, the sensing structure 500 may include a touch sensing electrode. As shown in FIG. 11, first sensing electrodes 382 and second sensing electrodes 384 may be disposed in the display area 10 on the upper substrate 410. Selectively, the insulating layer may be disposed between the upper substrate 410 and the first and second sensing electrodes 382 and 384. The first sensing electrodes 382 may extend in a second direction D2, and be spaced apart from each other in the first direction D1. The second sensing electrodes 384 may be spaced apart from each other in the second direction D2 between adjacent two first sensing electrodes 382 among the first sensing electrodes 382. In an embodiment, each of the first and second sensing electrodes 382 and 384 may include a carbon nano-tube ("CNT"), transparent conductive oxide, ITO, indium gallium zinc oxide ("IGZO"), zinc oxide (ZnO), graphene, silver nano-wire ("AgNW"), copper (Cu), chromium (Cr), and the like, for example.

The insulating layer may be disposed in the display area 10 on the first sensing electrodes 382 and the second sensing electrodes 384. The insulating layer may be disposed to have a uniform thickness along profiles of the first and second sensing electrodes 382 and 384 while covering the first and second sensing electrodes 382 and 384 in the display area 10. The insulating layer may include an organic material or an inorganic material. Selectively, the insulating layer may have a multi-layer structure including a plurality of insulating layers. In an embodiment, the insulating layers may have different thicknesses or include different materials, for example.

Sensing connection electrodes 386 may be disposed in the display area 10 on the insulating layer. The sensing connection electrodes 386 may electrically connect two second sensing electrodes 384, which are adjacent to each other in the first direction D1 among the second sensing electrodes 384, through the contact holes. In an embodiment, the sensing connection electrodes 386 may include the same material as that of the first and second sensing electrodes 382 and 384, for example. Selectively, the sensing connection electrodes 386 may include a metal, an alloy, metal nitride, conductive metal oxide, a transparent conductive material, or the like, for example. These may be used alone or in combination with each other.

The side electrode 470 may be disposed on the second side surface SS2 of the display device 100. In an embodiment, the side electrode 470 may contact one side surface of the lower substrate 110, one side surface of the upper substrate 410, one side surface of the pad electrode 430, and one side surface of the sealing member 390, on the second side surface SS2, for example. In embodiments, the side electrode 470 may directly contact or be electrically connected to the one side surface of the pad electrode 430, and may protrude from the second side surface SS2.

Although the display device 100 of the invention has been described as defining an organic light emitting display device, the configuration of the invention is not limited thereto. In other embodiments, the display device 100 may include a liquid crystal display ("LCD"), a field emission display ("FED"), a plasma display panel ("PDP"), and an electrophoretic display device ("EPD"), for example.

Figure 12:
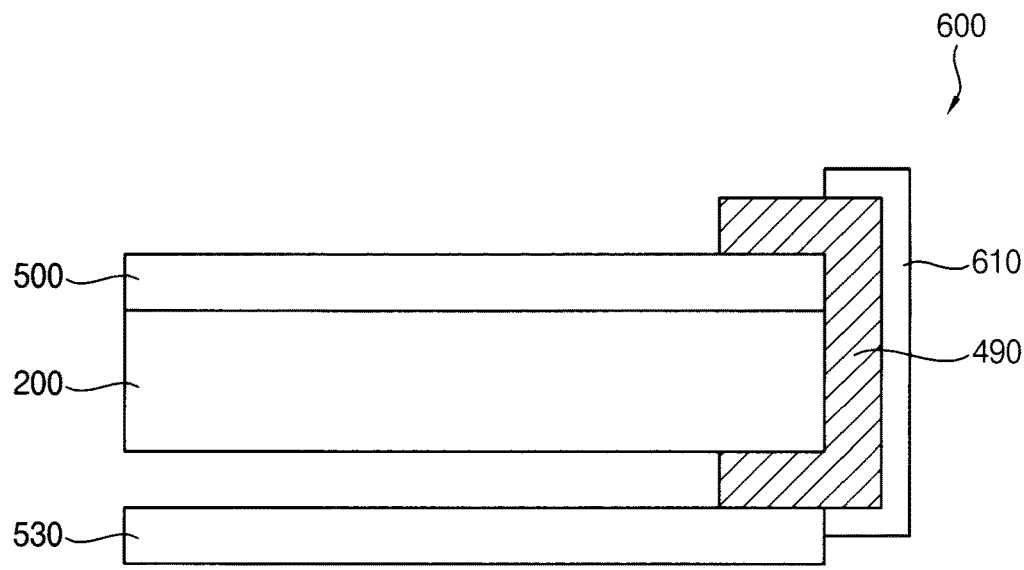
FIG. 12 is a cross-sectional view showing an embodiment of the display device according to the invention.

FIG. 12 is a cross-sectional view showing an embodiment of the display device according to the invention. The display device 600 illustrated in FIG. 12 may have a configuration substantially the same as or similar to the display device 100 described with reference to FIGS. 1 to 11 except for a protective layer 610. In FIG. 12, duplicate descriptions for components substantially the same as or similar to the components described with reference to FIGS. 1 to 11 will be omitted.

Referring to FIG. 12, the display device 600 may include a display panel 200, a sensing structure 500, a side electrode 470, a side surface connection electrode structure 490, a driving film 510, a sensing signal transfer film 530, a driving circuit board 550, a protective layer 610, and the like.

The side surface connection electrode structure 490 may be disposed at parts of an upper surface and a side surface of the sensing structure 500 and on parts of the first side surface SS1 (refer to FIG. 3) and the second surface S2 (refer to FIG. 4) of the display panel 200. In an embodiment, the side surface connection electrode structure 490 may include a straight portion, a first extension portion, and a second extension portion, for example. The straight portion may be disposed on the first side surface SS1 of the display panel 200 and the side surface of the sensing structure 500. The first extension portion may be disposed on a part of the upper surface of the sensing structure 500 and may extend from a first end of the straight portion in a plane direction of the upper surface. The second extension portion may be disposed between a part of the second surface S2 of the display panel 200 and the sensing signal transfer film 530, and may extend from a second end portion opposite to the first end portion of the straight portion in a plane direction of the second surface S2. The first extension portion may contact the sensing structure 500, and the second extension portion may contact the sensing signal transfer film 530. In other words, the side surface connection electrode structure 490 may electrically connect the sensing electrode included in the sensing structure 500 to the sensing signal transfer film 530.

The protective layer 610 may be disposed to cover the side surface connection electrode structure 490 on the first side surface SS1 of the display panel 200. The protective layer 610 may expose at least a part of each of the first and second extension portions of the side surface connection electrode structure 490. The sensing signal transfer film 530 may be electrically connected to the sensing structure 500 at the exposed portions of the first and second extension portions. The protective layer 610 may protect the side surface connection electrode structure 490. In an embodiment, the protective layer 610 may include an organic material such as photoresist, polyacryl-based resin, polyimide-based resin, polyamide-based resin, siloxane-based resin, acryl-based resin, and epoxy-based resin.

Figure 13:
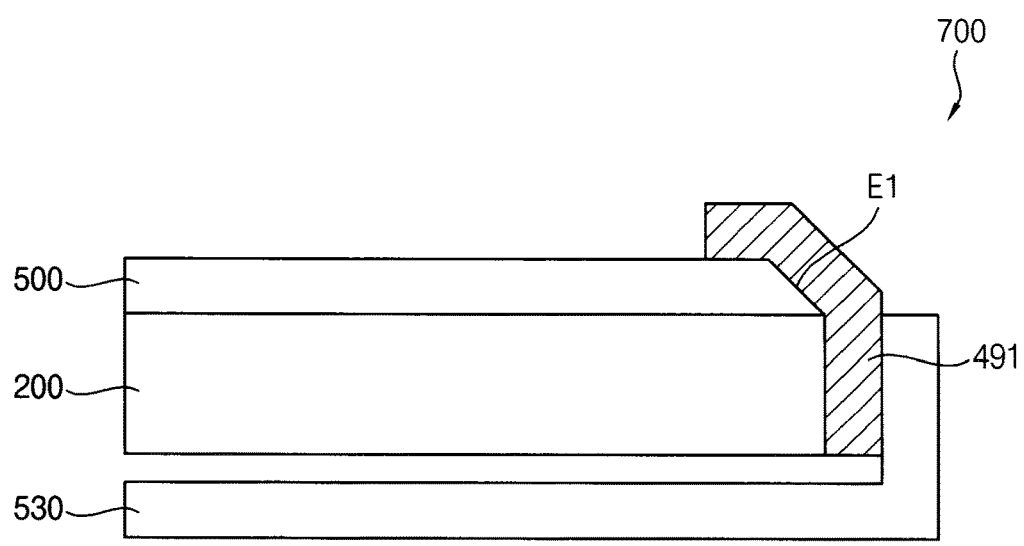
FIG. 13 is a cross-sectional view showing an embodiment of the display device according to the invention.

FIG. 13 is a cross-sectional view showing an embodiment of the display device according to the invention. The display device 700 illustrated in FIG. 13 may have a configuration substantially the same as or similar to the display device 100 described with reference to FIGS. 1 to 11 except for a shape of a side surface connection electrode structure 491. In FIG. 13, duplicate descriptions for components substantially the same as or similar to the components described with reference to FIGS. 1 to 11 will be omitted.

Referring to FIG. 13, the display device 700 may include a display panel 200, a side electrode 470, a sensing structure 500, a side surface connection electrode structure 491, a driving film 510, a sensing signal transfer film 530, a driving circuit board 550, and the like.

The sensing structure 500 may be disposed on the first surface S1 of the display panel 200. In embodiments, a side surface of the sensing structure 500 adjacent to the first side surface SS1 (refer to FIG. 3) of the display panel 200 may include an inclined plane E1.

The side surface connection electrode structure 491 may be disposed on parts of the upper surface and the side surface of the sensing structure 500 and on a part of the first side surface SS1 In an embodiment, the side surface connection electrode structure 491 may include a straight portion, an extension portion, and an inclined portion, for example. The straight portion may be disposed on the first side surface SS1 of the display panel 200, the inclined portion may be disposed on the inclined plane E1 of the sensing structure 500 and disposed between the straight portion and the extension portion, and the extension portion may be disposed on a part of the upper surface of the sensing structure 500 and extend from a first end portion of the inclined portion in a plane direction of the upper surface.

The sensing signal transfer film 530 may be disposed on the first side surface SS1 and on the second surface S2 of the display panel 200. One side of the sensing signal transfer film 530 may directly contact the straight portion of the side surface connection electrode structure 491, and the other side of the sensing signal transfer film 530 may be bent and directly contact a part of the driving circuit board 550.

When the display device 700 in embodiments includes the side surface connection electrode structure 491 having the inclined portion, a contact area between the side surface connection electrode structure 491, the sensing structure 500, and the display panel 200 may relatively increase.

Figure 14:
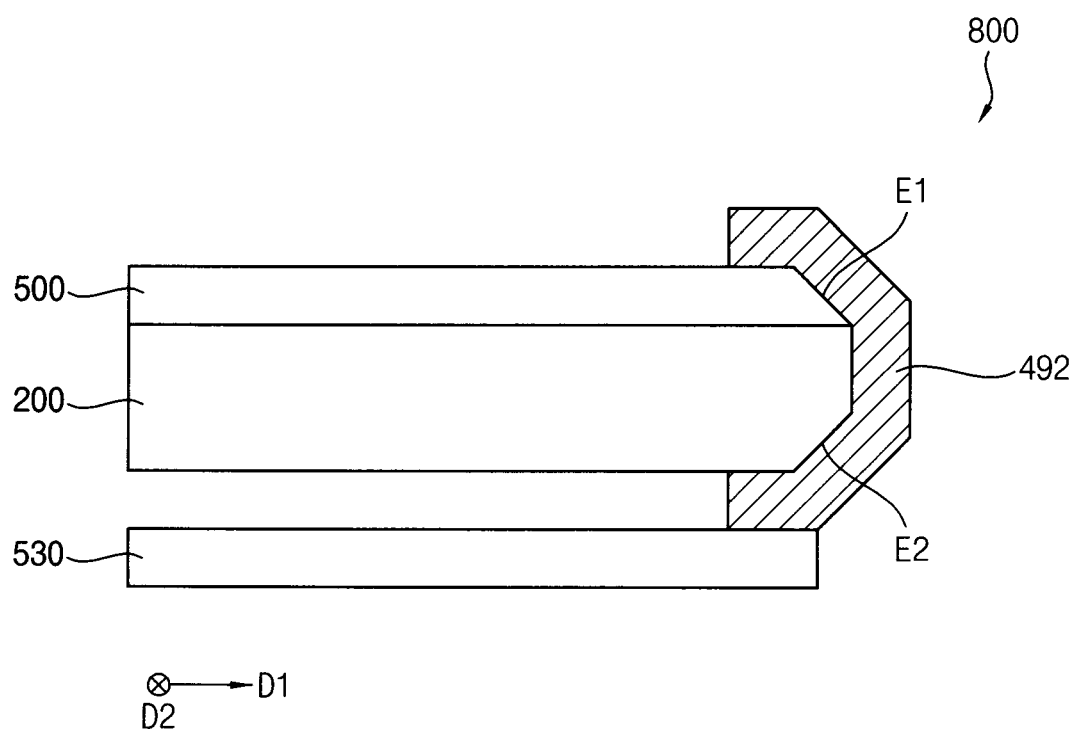
FIG. 14 is a cross-sectional view showing an embodiment of the display device according to the invention.

FIG. 14 is a cross-sectional view showing an embodiment of the display device according to the invention. The display device 800 illustrated in FIG. 14 may have a configuration substantially the same as or similar to the display device 700 described with reference to FIG. 13 except for a shape of a side surface connection electrode structure 492. In FIG. 14, duplicate descriptions for components substantially the same as or similar to the components described with reference to FIG. 13 will be omitted.

Referring to FIG. 14, the display device 700 may include a display panel 200, a side electrode 470, a sensing structure 500, a side surface connection electrode structure 492, a driving film 510, a sensing signal transfer film 530, a driving circuit board 550, and the like. The sensing structure 500 may be disposed on the first surface S1 (refer to FIG. 3) of the display panel 200. In embodiments, a side surface of the sensing structure 500 adjacent to the first side surface SS1 (refer to FIG. 3) of the display panel 200 may include a first inclined plane E1.

The display panel 200 may include a second inclined plane E2 at a portion facing the first inclined plane E1 of the sensing structure 500 so as to be symmetrical to the first inclined plane E1.

The side surface connection electrode structure 492 may be disposed at parts of an upper surface and a side surface of the sensing structure 500 and on parts of the first side surface SS1 and the second surface S2 of the display panel 200. In an embodiment, the side surface connection electrode structure 492 may include a straight portion, a first extension portion, a first inclined portion, a second incline portion, and a second extension portion, for example. The straight portion may be disposed on the first side surface SS1 of the display panel 200, the first inclined portion may be disposed on the first inclined plane E1 of the sensing structure 500 and disposed between the straight portion and the first extension portion, and the second inclined portion may be disposed on the second inclined plane E2 of the display panel 200 and disposed between the straight portion and the second extension portion. The first extension portion may be disposed on a part of the upper surface of the sensing structure 500 and extend from a first end portion of the first inclined portion in a plane direction of the upper surface. The second extension portion may be disposed between a part of the second surface S2 of the display panel 200 and the sensing signal transfer film 530, and extend from a first end portion of the second inclined portion in a plane direction of the second surface S2.

The sensing signal transfer film 530 may be disposed on the second surface S2 of the display panel 200. One side of the sensing signal transfer film 530 may directly contact the second inclined portion of the side surface connection electrode structure 490, and the other side of the sensing signal transfer film 530 may directly contact a part of the driving circuit board 550.

When the display device 800 in embodiments includes the side surface connection electrode structure 492 having the first and second inclined portions, a contact area between the side surface connection electrode structure 492, the sensing structure 500, and the display panel 200 may increase. Accordingly, the side surface connection electrode structure 492 may not be separated from the sensing structure 500 and the display panel 200.

The invention may be applied to various display devices including a display device. In embodiments, the invention may be applied to vehicle-display device, a ship-display device, an aircraft-display device, portable communication devices, display devices for display or for information transfer, a medical-display device, etc., for example The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
   a display panel including a first surface on which an image is displayed, a second surface opposite to the first surface, and first and second side surfaces connecting the first surface to the second surface;
   a sensing structure including a sensing electrode which is disposed on the first surface of the display panel and senses an element disposed in front of the display device;
   a sensing signal transfer film disposed on the second surface of the display panel; and a side surface connection electrode structure contacting each of a part of an upper surface of the sensing structure, at least a part of a side surface of the sensing structure, at least a part of the first side surface of the display panel and a part of the second surface of the display panel and electrically connecting the sensing electrode and the sensing signal transfer film.

2. The display device of claim 1, wherein the side surface connection electrode structure includes:
a straight portion disposed at the first side surface of the display panel and the side surface of the sensing structure;
a first extension portion disposed on the part of the upper surface of the sensing structure and extending from a first end portion of the straight portion in a plane direction of the upper surface; and
a second extension portion disposed between the part of the second surface of the display panel and the sensing signal transfer film and extending from a second end portion of the straight portion in a plane direction of the second surface.

3. The display device of claim 2, wherein the first extension portion contacts the sensing structure, and the second extension portion contacts the sensing signal transfer film.

4. The display device of claim 2, further comprising:
a protective layer partially covering the side surface connection electrode structure on the first side surface of the display panel, wherein
the protective layer exposes at least a part of each of the first and second extension portions.

5. The display device of claim 1, further comprising:
a driving circuit board partially overlapping the sensing signal transfer film on the second surface of the display panel and electrically connected to the sensing signal transfer film at an overlapping portion.

6. The display device of claim 5, wherein the driving circuit board includes a driving controller which generates sensing signals provided to the sensing electrode and a plurality of signals provided to the display panel to display the image.

7. The display device of claim 5, further comprising:
a side electrode disposed at the second side surface adjacent to the first side surface of the display panel.

8. The display device of claim 7, further comprising:
a driving film disposed on the second side surface and the second surface of the display panel and including:
a first end portion electrically connected to the side electrode on the second side surface; and
a second end portion electrically connected to the driving circuit board on the second surface.

9. The display device of claim 1, wherein the display panel further includes:
a lower substrate including a display area and a peripheral area surrounding the display area;
a display structure disposed in the display area on the lower substrate; and
an upper substrate disposed on the display structure and facing the lower substrate.

10. The display device of claim 9, wherein the lower substrate and the upper substrate have a same size and overlap each other.

11. The display device of claim 9, wherein the display panel further includes a sealing member disposed in the peripheral area between the upper substrate and the lower substrate.

12. The display device of claim 11, further comprising:
a pad electrode contacting the side electrode, disposed between the sealing member and the lower substrate, extending from the peripheral area to the display area, and electrically connected to the display structure.

13. A display device comprising:
a display panel including a first surface on which an image is displayed, a second surface opposite to the first surface, and first and second side surfaces connecting the first surface to the second surface;
a sensing structure including a sensing electrode which is disposed on the first surface of the display panel and senses an element disposed in front of the display device;
a sensing signal transfer film disposed on the first side surface and the second surface of the display panel; and
a side surface connection electrode structure contacting each of a part of an upper surface of the sensing structure, at least a part of a side surface of the sensing structure, and at least a part of the first side surface of the display panel and electrically connecting the sensing electrode and the sensing signal transfer film.

14. The display device of claim 13, wherein the side surface connection electrode structure includes:
a straight portion disposed at the first side surface of the display panel and a side surface of the sensing structure; and
a first extension portion disposed on a part of the upper surface of the sensing structure and extending in a plane direction of the upper surface.

15. The display device of claim 14, wherein the first extension portion contacts the sensing structure and the straight portion contacts the sensing signal transfer film.

16. The display device of claim 15, further comprising:
a driving circuit board partially overlapping the sensing signal transfer film on the second surface of the display panel and electrically connected to the sensing signal transfer film at the overlapping portion;
a side electrode disposed at the second side surface adjacent to the first side surface of the display panel; and
a driving film disposed on the second side surface and the second surface of the display panel and including:
a first end portion electrically connected to the side electrode at the second side surface; and
a second end portion electrically connected to the driving circuit board at the second surface.

17. The display device of claim 14, wherein a side surface of the sensing structure includes a first inclined plane at a portion in which the side surface connection electrode structure contacts the side surface of the sensing structure, and wherein
the side surface connection electrode structure further includes a first inclined portion disposed on the first inclined plane, and the first inclined portion is disposed between the straight portion and the first extension portion.

18. The display device of claim 17, wherein the display panel includes a second inclined plane at a portion facing the first inclined plane of the sensing structure, and wherein
the side surface connection electrode structure further includes:
a second extension portion disposed between a part of the second surface of the display panel and the sensing signal transfer film; and
a second inclined portion disposed on the second inclined plane of the display panel, in which the second incline portion is disposed between the straight portion and the second extension portion.

19. The display device of claim 18, wherein the first extension portion contacts the sensing structure, and the second extension portion contacts the sensing signal transfer film.

20. The display device of claim 13, wherein the display panel further includes:
a lower substrate including a display area and a peripheral area surrounding the display area;
a display structure disposed in the display area on the lower substrate; and
an upper substrate disposed on the display structure and opposite to the lower substrate, and wherein
the lower substrate and the upper substrate have a same size and overlap each other.

* * * * *